(12) United States Patent
Li et al.

(10) Patent No.: US 12,074,998 B2
(45) Date of Patent: Aug. 27, 2024

(54) DECORATING ASSEMBLY, HOUSING ASSEMBLY, AND ELECTRONIC DEVICE

(71) Applicant: Huawei Technologies Co., Ltd., Shenzhen (CN)

(72) Inventors: Shizhe Li, Shanghai (CN); Mengruo Zou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 342 days.

(21) Appl. No.: 17/761,395

(22) PCT Filed: Aug. 19, 2020

(86) PCT No.: PCT/CN2020/109997
§ 371 (c)(1),
(2) Date: Mar. 17, 2022

(87) PCT Pub. No.: WO2021/052090
PCT Pub. Date: Mar. 25, 2021

(65) Prior Publication Data
US 2022/0377163 A1  Nov. 24, 2022

(30) Foreign Application Priority Data
Sep. 18, 2019 (CN) .......................... 201910883226.3

(51) Int. Cl.
*H04M 1/02* (2006.01)
*H04M 1/03* (2006.01)
(Continued)

(52) U.S. Cl.
CPC ......... *H04M 1/0283* (2013.01); *H04M 1/035* (2013.01); *H04M 1/18* (2013.01);
(Continued)

(58) Field of Classification Search
CPC ...... H04M 1/0283; H04M 1/035; H04M 1/18; H04M 1/03; H04M 1/026; H04R 1/22; H04R 2499/11; H05K 5/068
See application file for complete search history.

(56) References Cited

U.S. PATENT DOCUMENTS 6,506,110 B1    1/2003  Borisch
2014/0161293 A1  6/2014  Wang et al.
(Continued)

FOREIGN PATENT DOCUMENTS

CN    202713849 U    1/2013
CN    103068191 A    4/2013
(Continued)

*Primary Examiner* — Marisol Figueroa
(74) *Attorney, Agent, or Firm* — Slater Matsil, LLP

(57) ABSTRACT

This application provides a decorating assembly, a housing assembly, and an electronic device. Gas flows between the outside of the electronic device, the first gap, the first channel, the breathable space, the waterproof breathable film, and the first space to implement a quick balance between internal air pressure of the first space and external air pressure of the electronic device. In addition, the waterproof breathable film is installed on the base, and the waterproof breathable film covers the breathable space, to ensure that when the decorating assembly is applied to the electronic device, the waterproof breathable film can prevent external liquid of the electronic device from entering the first space through the breathable space, thereby ensuring that the electronic device has relatively good waterproof performance.

20 Claims, 21 Drawing Sheets

(51) Int. Cl.
*H04M 1/18* (2006.01)
*H04R 1/22* (2006.01)
*H05K 5/06* (2006.01)
(52) U.S. Cl.
CPC ............... *H04R 1/22* (2013.01); *H05K 5/068* (2013.01); *H04R 2499/11* (2013.01)

(56) References Cited

U.S. PATENT DOCUMENTS

2015/0114090 A1    4/2015  Fukuda
2019/0057242 A1*   2/2019  Guo ....................... G06V 10/17

FOREIGN PATENT DOCUMENTS

| | | |
|---|---|---|
| CN | 105144858 A | 12/2015 |
| CN | 205490689 U | 8/2016 |
| CN | 106900151 A | 6/2017 |
| CN | 206559809 U | 10/2017 |
| CN | 107508952 A | 12/2017 |
| CN | 207251711 U | 4/2018 |
| CN | 207802093 U | 8/2018 |
| CN | 208971809 U | 6/2019 |
| CN | 209314160 U | 8/2019 |
| JP | 2009010234 A | 1/2009 |
| JP | 2010109851 A | 5/2010 |
| WO | 2012073513 A1 | 6/2012 |
| WO | 2017163560 A1 | 9/2017 |

\* cited by examiner

DECORATING ASSEMBLY, HOUSING ASSEMBLY, AND ELECTRONIC DEVICE

CROSS-REFERENCE TO RELATED APPLICATIONS

This application is a National Stage of International Application No. PCT/CN2020/109997, filed on Aug. 19, 2020, which claims priority to Chinese Patent Application No. 201910883226.3, filed on Sep. 18, 2019. Both of the aforementioned applications are hereby incorporated by reference in their entireties.

TECHNICAL FIELD

This application relates to the field of electronic product technologies, and in particular, to a decorating assembly, a housing assembly, and an electronic device.

BACKGROUND

As waterproof performance of electronic devices such as a mobile phone and a tablet computer becomes better, air tightness of the electronic devices also becomes better. When a housing of an electronic device is deformed due to an external force, internal air pressure of the electronic device changes. In this case, the internal air pressure of the electronic device is different from external air pressure of the electronic device, causing an imbalance between internal and external air pressure of a separate audio component (such as a receiver or a speaker), and then causing noise for the audio component due to a diaphragm offset.

SUMMARY

This application provides a decorating assembly, a housing assembly, and an electronic device that can quickly balance internal and external air pressure while ensuring relatively good waterproof performance.

According to a first aspect, this application provides a decorating assembly. The decorating assembly includes a decorating part, a first adhesive layer, a cover, and a waterproof breathable film. The decorating part includes a base and a decorating ring. The base includes a first surface and a second surface that are oppositely disposed. The decorating ring protrudes from a peripheral edge of the first surface. A breathable space is disposed in the base. The breathable space penetrates from the first surface to the second surface. The breathable space is located inside the decorating ring. The first adhesive layer is located inside the decorating ring and is connected to the first surface through fastening. The first adhesive layer forms a first channel connected to the breathable space. The cover is connected, through fastening, to a surface that is of the first adhesive layer and that faces away from the base. A first gap is formed between a peripheral side face of the cover and an inner side face of the decorating ring. The first gap is connected to the breathable space through the first channel. The waterproof breathable film is fastened onto the base and covers the breathable space. It may be understood that the waterproof breathable film can be fastened onto the first surface, or fastened onto the second surface, or fastened into the breathable space.

In this implementation, when the decorating assembly is applied to an electronic device, and a screen or a housing of the electronic device is pressed, a first space of the electronic device decreases, and air pressure of the first space increases. In this case, gas in the first space flows out of the electronic device through the waterproof breathable film, the breathable space, the first channel, and the first gap, so that air pressure of the first space decreases to be the same as external air pressure of the electronic device.

After a pressing action is withdrawn, the first space of the electronic device increases, and air pressure of the first space decreases. In this case, external gas of the electronic device enters the first space through the first gap, the first channel, the breathable space, and the waterproof breathable film, so that air pressure of the first space increases to be the same as external air pressure of the electronic device.

Therefore, gas flows between the outside of the electronic device, the first gap, the first channel, the breathable space, the waterproof breathable film, and the first space to implement a quick balance between internal air pressure of the first space and external air pressure of the electronic device.

In addition, the waterproof breathable film is installed on the base, and the waterproof breathable film covers the breathable space, to ensure that when the decorating assembly is applied to the electronic device, the waterproof breathable film can prevent external liquid of the electronic device from entering the first space through the breathable space, thereby ensuring that the electronic device has relatively good waterproof performance.

In addition, the decorating assembly is a separate component, in other words, the decorating assembly is of an integral structure. In this case, in an assembling process of a housing assembly, first, the decorating part, the first adhesive layer, and the cover may be assembled into the decorating assembly, namely, an integral assembly, and then, the decorating assembly may be fastened to the housing. Clearly, compared with a solution in which the decorating part and the cover are separately assembled onto the housing, in this implementation, the integral decorating assembly is assembled onto the housing, so that the assembling process is simple and has a low difficulty coefficient. Therefore, in this implementation, the decorating part, the first adhesive layer, and the cover are disposed as the integral decorating assembly, so that an assembling step of the housing assembly can be simplified, and assembling difficulty can be reduced.

In an implementation, there are a plurality of first channels. The plurality of first channels are connected to the breathable space in different directions.

It may be understood that when the decorating assembly is applied to the electronic device, after external gas of the electronic device enters the first gap, the gas can enter the first channels in different directions, and enter the breathable space in different directions through the first channels. In this case, the gas has a relatively large flowing amount and a relatively high flowing speed, so that air pressure of the first space can be quickly balanced with external air pressure of the electronic device. Similarly, after gas in the first space flows into the breathable space, the gas can enter the first channels in different directions, so that the gas quickly enters the first gap in different directions through the first channels, and flows out of the electronic device through the first gap, thereby quickly balancing air pressure of the first space with external air pressure of the electronic device.

In addition, when a first channel in one of the directions is blocked, first channels in the other directions still ensure that gas flows into the breathable space through the first gap, thereby ensuring that air pressure of the first space can always be quickly balanced with external air pressure of the electronic device.

In an implementation, the first adhesive layer includes a plurality of spaced-apart adhesive blocks. A space between each two adhesive blocks forms a first channel.

It may be understood that the first adhesive layer is disposed as the plurality of spaced-apart adhesive blocks, so that a quantity of first channels can be significantly increased when installation difficulty of the first adhesive layer is reduced, thereby ensuring that gas can quickly flow into the breathable space through the first gap and the first channel. Specifically, compared with a manner in which an integral first adhesive layer is connected to the base through fastening, in this implementation, the adhesive blocks are formed in different regions of the base, so that there is no need to consider that the first adhesive layer in this implementation cannot be assembled onto the base because an area of the first adhesive layer is set to be too large or too small. Therefore, a forming process of the first adhesive layer in this implementation is relatively simple. In addition, when the first adhesive layer is the plurality of spaced-apart adhesive blocks, space between each two adhesive blocks can form a first channel. In this case, more adhesive blocks indicate more first channels, more gas circulation channels, and a higher air pressure balancing speed.

In an implementation, a second channel is formed between the first adhesive layer and the inner side face of the decorating ring. The second channel is connected to the first gap and the first channel. In this case, the second channel is disposed around the inner side face of the decorating ring, and the second channel is of an intermittent annular structure. In this case, the first gap between the cover and the decorating ring can be connected to the first channel to a large extent through the second channel.

Specifically, when the cover can be accurately assembled onto the decorating ring, any position of the peripheral side face of the cover is not in contact with the inner side face of the decorating ring, in other words, the first gap between the cover and the decorating ring is of a continuous annular structure. In addition, because the second channel is disposed around the inner side face of the decorating ring, most of the first gap can be connected to the second channel. In this case, after external gas of the electronic device enters the first gap in different directions, the gas can also smoothly continue to flow into the first channel in different directions through the second channel, in other words, the gas can quickly flow into the first channel through the first gap, in other words, the gas relatively smoothly flows between the first gap and the first channel, thereby quickly balancing air pressure of the first space with external air pressure of the electronic device. Similarly, after gas in the first space flows into the breathable space, the gas can quickly enter the first gap in different directions through the second channel, so that the gas can quickly flow out of the electronic device through the first gap, thereby quickly balancing air pressure of the first space with external air pressure of the electronic device.

In addition, when the cover cannot be accurately assembled onto the decorating ring, at least one position of the peripheral side face of the cover is in contact with the inner side face of the decorating ring, in other words, the first gap between the cover and the decorating ring is of a non-continuous shape. For example, when the cover is assembled onto the base, the cover inclines to a side or approaches a side. In this case, an inclined position of the cover is in contact with the inner side face of the decorating ring. In this case, there is no first gap in a contact place between the cover and the inner side face of the decorating ring. In this case, the contact position between the cover and the decorating ring forms an unconnected region with the second channel. In this case, after gas in the first space flows into the second channel through the breathable space, because the second channel is disposed around the inner side face of the decorating ring, the gas can bypass the unconnected region along the second channel, and flow out of the electronic device from a connected region between the second channel and the first gap, thereby quickly balancing air pressure of the first space with external air pressure of the decorating assembly.

In this implementation, the second channel is disposed around the inner side face of the decorating ring, so that airflow blocking caused by blocking of a partial region of the first gap can be avoided, thereby ensuring that air pressure of the first space can still be quickly balanced with external air pressure of the electronic device when assembling accuracy of the cover and the decorating ring is not enough.

In an implementation, a first groove is disposed in the base. An opening of the first groove is located on the first surface. The first groove just faces and is connected to the first channel.

It may be understood that when the first groove is disposed in the base, the first groove may significantly increase a volume of the first channel, in other words, more gas can circulate through the first channel, thereby significantly improving a gas circulation capability between the first channel and the first gap.

In an implementation, a second groove is disposed in the decorating ring. An opening of the second groove is located on the inner side face of the decorating ring. The second groove is annularly disposed along the inner side face of the decorating ring. The second groove is connected to the first gap.

In this implementation, the second groove is disposed in the decorating ring, and the second groove is connected to the first gap, to significantly increase a volume of a connection position between the first channel and the first gap, thereby improving a gas circulation capability of gas between the first channel and the first gap.

In addition, when the cover cannot be accurately assembled onto the decorating ring, at least one position of a surface that is of the cover and that faces the decorating ring is in contact with the inner side face of the decorating ring. In this case, the contact position between the cover and the decorating ring forms an unconnected region with the second channel. In this case, after gas in the first space flows into the second channel through the breathable space, because the second groove is annularly disposed around the inner side face of the decorating ring, the gas can bypass the unconnected region along the second groove, and flow out of the electronic device from a connected region between the second channel and the first gap.

In an implementation, the decorating part further includes a reinforcing rib. The reinforcing rib is disposed in the second groove. It may be understood that the reinforcing rib can improve structural strength of the decorating ring, and reduce a deformation risk of the decorating ring. Therefore, when the decorating ring is squeezed or collided with by the outside, the decorating ring has enough strength to offset this part of pressure, to prevent the cover from being crushed because the decorating ring is deformed, thereby effectively protecting the cover.

In an implementation, the decorating part further includes a positioning plate. The positioning plate protrudes from the second surface.

It may be understood that when the decorating part includes the positioning plate, structural strength and stability of the decorating part are better. In addition, when a user applies pressure to the decorating assembly, the decorating part can assist the decorating assembly in better supporting a pressing force of the user. In this case, the positioning plate protrudes from the second surface, so that the decorating part having the positioning plate can further assist the decorating assembly in better supporting the pressing force of the user.

In an implementation, the decorating assembly further includes a reinforcing bracket. The reinforcing bracket is connected to the positioning plate through fastening.

It may be understood that the reinforcing bracket is connected to the positioning plate through fastening, to further improve structural strength of the decorating assembly. Specifically, when a user applies pressure to the decorating assembly, the reinforcing bracket can assist the decorating assembly in better supporting a pressing force of the user.

In an implementation, the decorating assembly further includes a third adhesive layer. The third adhesive layer is connected between the reinforcing bracket and the positioning plate through fastening. In this case, the third adhesive layer can enable the reinforcing bracket to be stably connected to the positioning plate.

According to a second aspect, this application provides a housing assembly. The housing assembly includes a housing and the foregoing decorating assembly. The housing includes a first face and a second face that are oppositely disposed. A first space is formed on a side that is of the second face and that is far away from the first face. The base of the decorating assembly is located on a side that is of the first face and that is far away from the second face, and the second surface of the base faces the first face. The breathable space of the base is connected to the first space.

It may be understood that when the decorating assembly is applied to the housing assembly, the housing assembly can quickly balance internal and external air pressure. In addition, the waterproof breathable film of the decorating assembly can prevent external liquid of the housing assembly from entering the first space through the breathable space.

In an implementation, a second gap is formed between the second surface and the first face. A second through hole is disposed in the base. The second through hole is located inside the decorating ring. The second through hole penetrates through the first surface and the second surface. The second through hole is connected to the first channel and the second gap.

It may be understood that when the second through hole is connected to the first channel and the second gap, external gas of the housing assembly can enter the first space along the following second path. The second path is specifically "the outside of the housing assembly, the second gap, the second through hole, the first channel, the breathable space, the waterproof breathable film, and the first space". Therefore, when the housing assembly is applied to an electronic device, gas flows along the second path to implement a further quick balance between air pressure of the first space and external air pressure of the decorating assembly.

In an implementation, a third through hole is disposed in the housing. The third through hole penetrates from the first face to the second face. The third through hole is connected to the breathable space and the first space.

It may be understood that the third through hole is connected to the breathable space and the first space, to ensure that external gas of the housing assembly that enters the breathable space can enter the first space through the third through hole, thereby ensuring that pressure of the first inner cavity can be quickly balanced with external pressure of the housing assembly.

In an implementation, a third through hole is disposed in the housing. The third through hole penetrates from the first face to the second face. A part of the decorating assembly extends into the first space through the third through hole.

It may be understood that when the part of the decorating assembly extends into the first space through the third through hole, external gas of the housing assembly can directly enter the first space through the breathable space, thereby ensuring that pressure of the first inner cavity can be quickly balanced with external pressure of the housing assembly.

In addition, the decorating assembly has an overlapping region with the housing in a thickness direction, thereby reducing a thickness of the housing assembly.

In an implementation, the housing assembly includes a second adhesive layer. The second adhesive layer is located on a side that is of the second through hole and that is close to the third through hole and is disposed around the second through hole, and the second adhesive layer is connected between the second surface and the first face through fastening.

It may be understood that the second adhesive layer is disposed between the decorating assembly and the first face, so that the decorating assembly can be stably connected to the housing through fastening. In addition, because the second adhesive layer is disposed around the third through hole, when external liquid (for example, a water stain or a stain) of the electronic device enters a gap between the decorating assembly and the first face, the second adhesive layer can prevent the external liquid of the electronic device from entering the first space through the third through hole. Therefore, in this implementation, the second adhesive layer has a "one for two uses" effect.

In an implementation, the decorating assembly further includes a fourth adhesive layer, and the fourth adhesive layer is connected between the reinforcing bracket and the second face through fastening.

It may be understood that, when the reinforcing bracket is connected to the second face of the housing by using the fourth adhesive layer, the decorating part, the housing, and the reinforcing bracket form a three-layer structure, in other words, the decorating part, the housing, and the reinforcing bracket form a structure with better structural strength. In this case, overall stability and structural strength of the electronic device are further improved. In addition, because the reinforcing bracket is connected to the decorating part by using the third adhesive layer, strength and stability of a structure formed by the decorating part, the housing, and the reinforcing bracket are better.

According to a third aspect, this application provides an electronic device. The electronic device includes an audio component and the foregoing housing assembly. The audio component is located in the first space, and a rear box of the audio component is connected to the first space.

It may be understood that when the housing assembly is applied to the electronic device, internal and external air pressure of the electronic device can be quickly balanced. In addition, the rear box of the audio component in the first space is connected to the first space. Therefore, air pressure of the rear box of the audio component can also decrease to be same as external air pressure of the electronic device. In addition, because a front box of the audio component is connected to the outside of the electronic device, a balance can be quickly reached between air pressure of the front box and air pressure of the rear box of the audio component, so that the audio component can normally work.

In an implementation, the electronic device further includes a photographing component. The photographing component is installed in the first space through fastening. A first penetrating hole is disposed in the base. The first penetrating hole penetrates through the first surface and the second surface. The first penetrating hole is located in an enclosed region of the first adhesive layer. The first penetrating hole is connected to the first space. The photographing component collects ambient light emitted through the cover and the first penetrating hole.

It may be understood that when the decorating assembly is applied to the electronic device, the decorating assembly can be used to quickly balance internal and external air pressure of the electronic device to ensure that the audio component disposed in the first space can be in a normal working state, and can also provide a transparent region for the photographing module, so that the photographing module can collect external light of the electronic device by using the decorating assembly. Therefore, the decorating assembly in this implementation has a "one for two uses" function.

DETAILED DESCRIPTION OF ILLUSTRATIVE EMBODIMENTS

Figure 1:
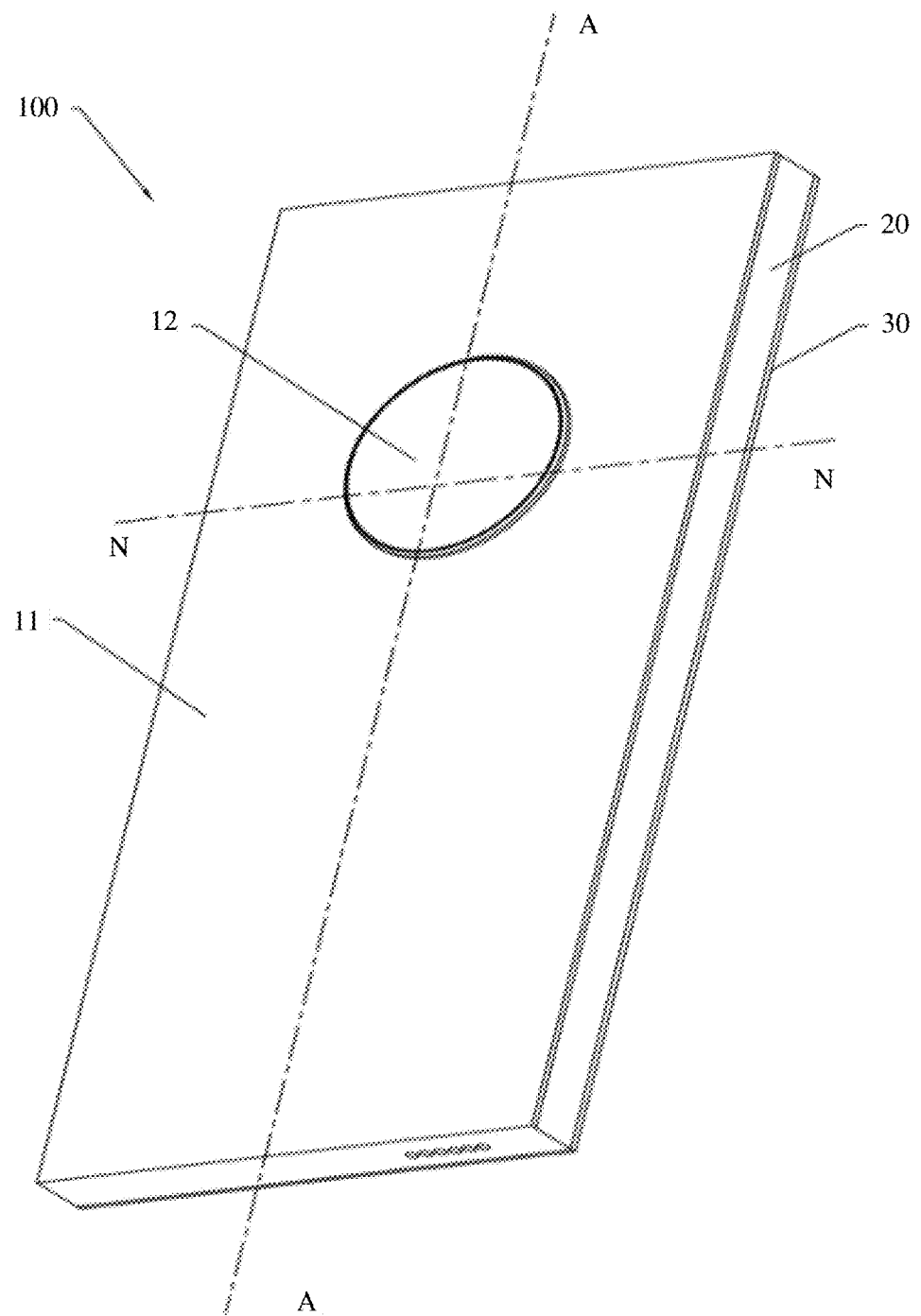
FIG. 1 is a schematic diagram of a structure of an electronic device according to an embodiment of this application.

FIG. 1 is a schematic diagram of a structure of an electronic device 100 according to an embodiment of this application. The electronic device 100 may be a tablet computer, a mobile phone, a camera, a personal computer, a notebook computer, a vehicle-mounted device, a wearable device, augmented reality (augmented reality, AR) glasses, an AR helmet, virtual reality (virtual reality, VR) glasses, or a VR helmet. In the embodiment shown in FIG. 1, the electronic device 100 is described by using the mobile phone as an example.

Figure 2:
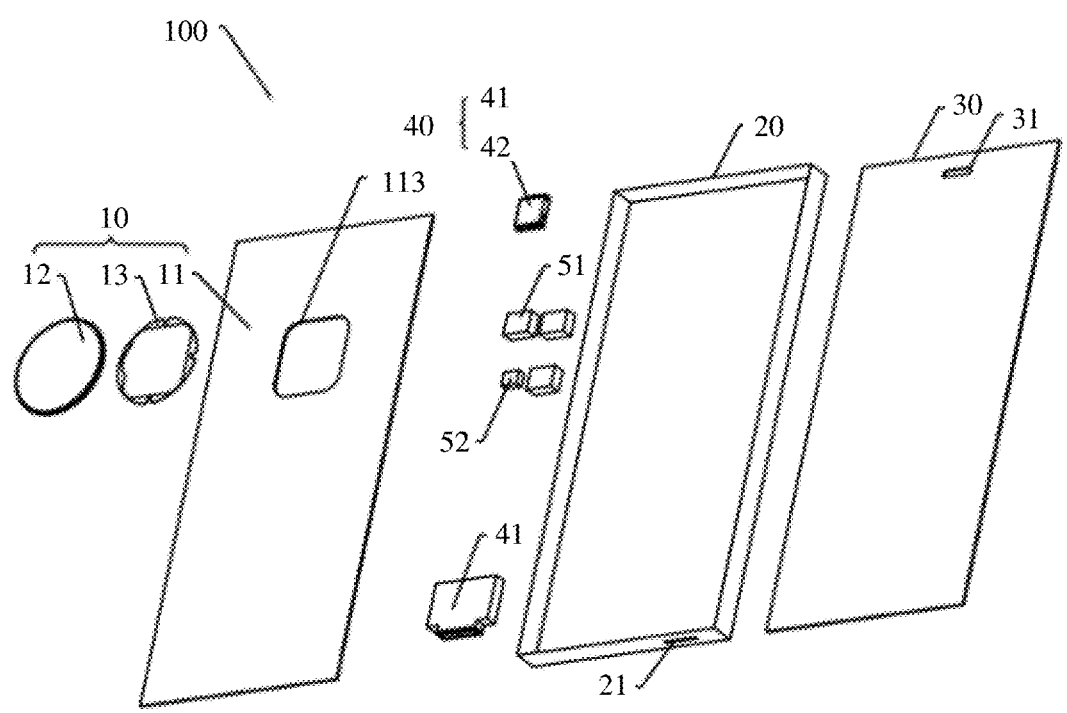
FIG. 2 is a partial schematic exploded diagram of the electronic device shown in FIG. 1.
Figure 3:
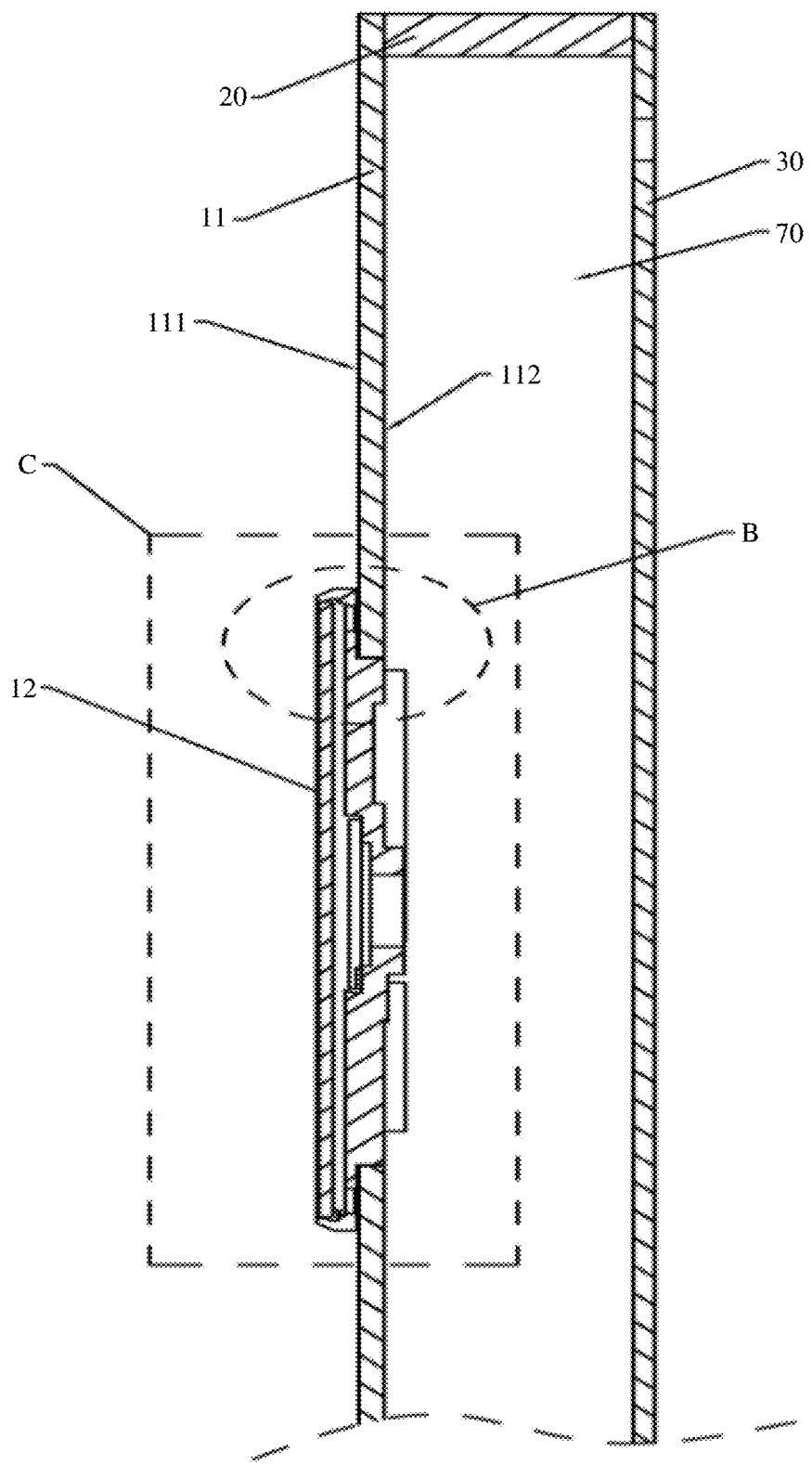
FIG. 3 is a partial schematic cross-sectional diagram of an implementation of the electronic device shown in FIG. 1 at a line A-A.

FIG. 2 is a partial schematic exploded diagram of the electronic device shown in FIG. 1. FIG. 3 is a partial schematic cross-sectional diagram of an implementation of the electronic device shown 100 in FIG. 1 at a line A-A.

The electronic device 100 includes a housing 11, a bezel 20, and a screen 30. The housing 11 may be a rear cover of the electronic device 100. A material of the rear cover may be a metal material, may be a glass material, or may be a plastic material. The housing 11 and the screen 30 are respectively connected to two opposite sides of the bezel 20 through fastening. With reference to FIG. 1, the housing 11, the bezel 20, and the screen 30 form an approximately cuboid structure.

In addition, the housing 11, the bezel 20, and the screen 30 jointly form a first space 70 of the electronic device 100 through enclosing. The housing 11 includes a first face 11 and a second face 112 that are oppositely disposed. The first face 11 faces away from the first space 70, in other words, the first face 11 forms a partial appearance face of the electronic device 100. The second face 112 faces the first space 70, in other words, the first space 70 is a space on a side that is of the second face 112 and that is far away from the first face 11, and the second face 112 forms a partial inner surface of the electronic device 100. It may be understood that the first space 70 is configured to accommodate related electronic components in the electronic device 100, for example, the following photographing module 51, camera flash 52, and audio component 40.

In an implementation, the housing 11 is integrally formed with the bezel 20. In this case, overall structural strength of the housing 11 and the bezel 20 is relatively good.

In an implementation, the electronic device 100 may further include a middle plate (not shown in the figure). The middle plate is of a plate-like structure. The middle plate may be formed by using an injection molding process. The middle plate may be directly formed on the bezel 20, thereby forming an integral with the bezel 20. The middle plate is configured to bear the screen 30. In this case, the middle plate can ensure stability of connection between the screen 30 and the bezel 20, and can also provide a support force for the screen 30, to prevent the screen 30 from collapsing.

It may be understood that the screen 30 includes a protection cover and a display. The protection cover is laminated on the display to protect the display. A material of the protection cover may be a transparent material, such as glass. In addition, the display is configured to display an image. The display may be but is not limited to only a liquid crystal display (liquid crystal display, LCD). For example, the display may be alternatively an organic light-emitting diode (Organic Light-Emitting Diode, OLED) display.

In an implementation, a touch function may be further integrated into the screen 30, in other words, the screen 30 is a touchscreen. In addition, a mainboard (not shown in the figure) is installed in the first space 70. A processor (not shown in the figure) and a memory (not shown in the figure) are disposed on the mainboard. The memory is configured to store computer program code. The computer program code includes computer instructions. The processor is configured to invoke the computer instructions to enable the electronic device 100 to perform corresponding operations. In this case, the screen 30 is electrically connected to the processor. The screen 30 can generate a touch signal, and transmit the touch signal to the processor. The processor receives the touch signal, and controls startup of an application (Application, app) on the screen 30 based on the touch signal.

Refer to FIG. 2 and FIG. 3 again. A third through hole 113 is disposed in the housing 11. The third through hole 113 penetrates from the first face 111 to the second face 112. The third through hole 113 is connected to the first space 70. In addition, the electronic device 100 further includes a second adhesive layer 13 and a decorating assembly 12. The housing 11, the second adhesive layer 13, and the decorating assembly 12 form a housing assembly 10. The second adhesive layer 13 is of an annular structure. A part of the decorating assembly 12 is connected to the housing 11 by using the second adhesive layer 13.

Figure 4:
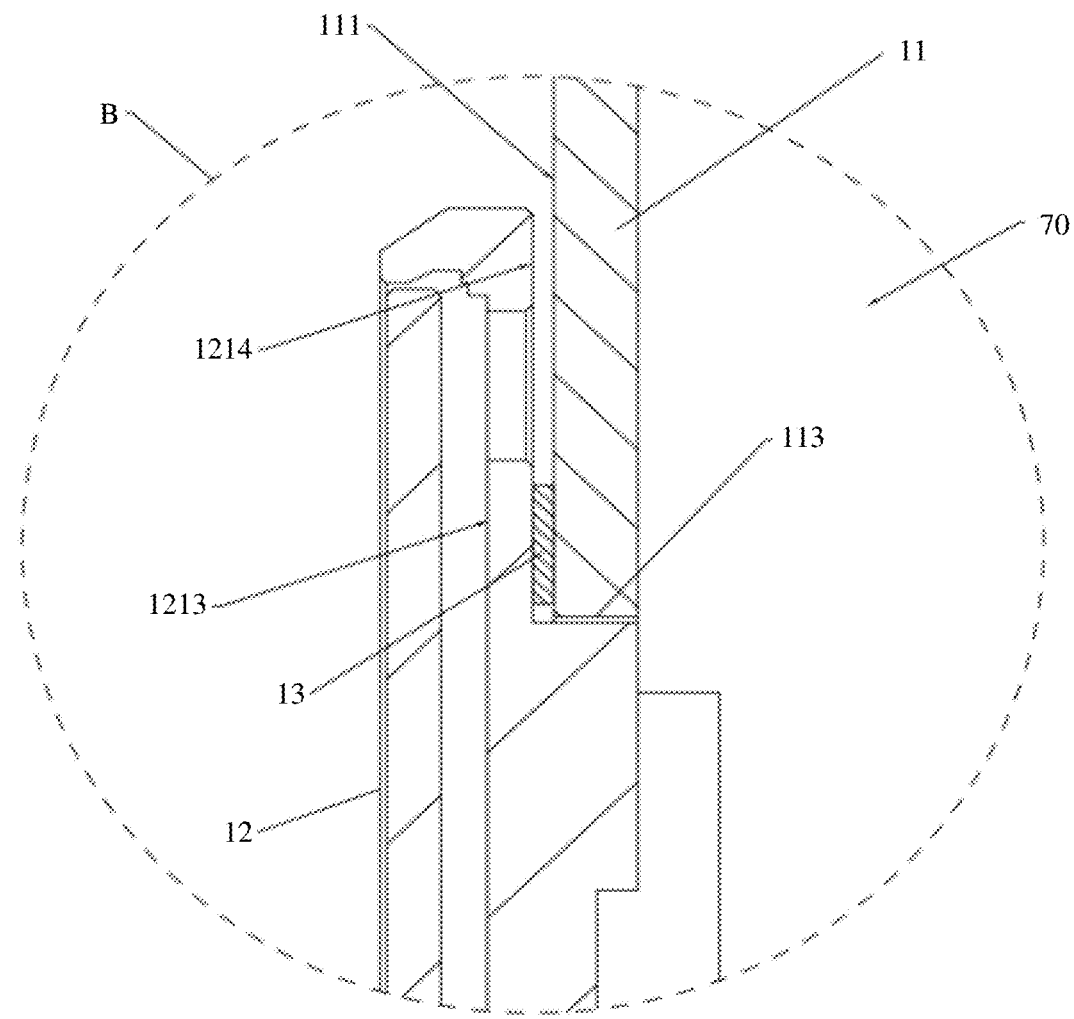
FIG. 4 is a schematic enlarged diagram of a position B of the electronic device shown in FIG. 3.

FIG. 4 is a schematic enlarged diagram of a position B of the electronic device 100 shown in FIG. 3.

The second adhesive layer 13 is adhered to the first face 11 of the housing 11, and the second adhesive layer 13 is disposed around the third through hole 113, in other words, the third through hole 113 is located in an enclosed region of the second adhesive layer 13. In addition, the part of the decorating assembly 12 is connected to the first face 111 of the housing 11 by using the second adhesive layer 13, in other words, the second adhesive layer 13 is connected between the decorating assembly 12 and the first face 111. In addition, a part of the decorating assembly 12 extends into the first space 70 through the third through hole 113.

It may be understood that the second adhesive layer 13 is disposed between the decorating assembly 12 and the first face 11, so that the decorating assembly 12 can be stably connected to the housing 11 through fastening. In addition, because the second adhesive layer 13 is disposed around the third through hole 113, when external liquid (for example, a water stain or a stain) of the electronic device 100 enters a gap between the decorating assembly 12 and the first face 11, the second adhesive layer 13 can prevent the external liquid of the electronic device 100 from entering the first space 70 through the third through hole 113. Therefore, in this implementation, the second adhesive layer 13 has a "one for two uses" effect.

In addition, with reference to FIG. 1, at least a part of the decorating assembly 12 is exposed relative to the housing 11.

It may be understood that, in an assembling process of the electronic device 100, first, the housing 11, the second adhesive layer 13, and the decorating assembly 12 may be assembled into the housing assembly 10, namely, an integral assembly, and then, the housing assembly 10 may be fastened to the bezel 20, to complete assembling of the integral housing assembly 10 of the electronic device 100, so that an assembling step of the electronic device 100 can be simplified, and assembling difficulty can be reduced.

Refer to FIG. 2 and FIG. 3 again. The electronic device 100 further includes a photographing module 51. The photographing module 51 is installed in the first space 70. The photographing module 51 just faces the decorating assembly 12, and collects external ambient light of the electronic device 100 by using the decorating assembly 12. The following specifically describes a specific implementation in which the photographing module 51 collects external ambient light of the electronic device 100 by using the decorating assembly 12. Details are not described herein.

It may be understood that the photographing module 51 may be a single-camera module, a dual-camera module, or a multi-camera module (including three or more cameras). In addition, the photographing module 51 may be but is not limited to only at least one of an auto focus (Auto Focus, AF) module, a fix focus (Fix Focus, FF) module, a wide-angle photographing module, a long-focus photographing module, a color photographing module, or a monochrome photographing module.

In an implementation, the photographing module 51 is electrically connected to the processor on the mainboard. In this case, the processor can control the photographing module 51 to take an image. When a user inputs a photographing instruction, the processor receives the photographing instruction. The processor controls, according to the photographing instruction, the photographing module 51 to photograph a photographed object.

In an implementation, the electronic device 100 further includes a camera flash 52. The camera flash 52 is installed in the first space 70, and the camera flash 52 just faces the decorating assembly 12. The camera flash 52 emits light to the outside of the electronic device 100 by using the decorating assembly 12. The camera flash 52 is configured to assist the photographing module 51 in collecting ambient light. Specifically, the camera flash 52 may improve intensity of ambient light of the photographing module 51 in a photographing process.

In another implementation, the electronic device 100 further includes a fingerprint recognition module or a structured light module. The fingerprint recognition module or the structured light module is installed in the first space 70 and just faces the decorating assembly 12, and collects an external signal of the electronic device 100 by using the decorating assembly 12.

Refer to FIG. 2 and FIG. 3 again. The electronic device 100 further includes an audio component 40. The audio component 40 is installed in the first space 70.

It may be understood that the audio component 40 includes but is not limited to a speaker (also referred to as a loudspeaker) 41 and a receiver (also referred to as a telephone receiver) 42. A position of the speaker 41 is not limited to the bottom of the electronic device 100 shown in FIG. 2. A position of the receiver 42 is not limited to the top of the electronic device 100 shown in FIG. 2.

Specifically, a first sound output hole 21 is disposed in the bezel 20. The first sound output hole 21 is connected to the outside of the electronic device 100. A front box of the speaker 41 is connected to the first sound output hole 21. A sound emitted by the speaker 41 is transmitted to the outside of the electronic device 100 through the first sound output hole 21. A rear box of the speaker 41 is connected to the first space 70.

In addition, a second sound output hole 31 is disposed on the screen 30. It may be understood that the second sound output hole 31 may be disposed on the protection cover, or may be disposed on the display. When the second sound output hole 31 is disposed on the display, the second sound output hole 31 can be disposed in a non-display region of the display, or disposed in a display region. The second sound output hole 31 is connected to the outside of the electronic device 100. A front box of the receiver 42 is connected to the second sound output hole 31, and the receiver 42 emits a sound to an external space of the electronic device 100 through the second sound output hole 31. A rear box of the receiver 42 is connected to the first space 70.

The following uses the speaker 41 as an example to specifically describe a structure of the speaker 41, and specifically describe a change that occurs in a structure of a speaker 41 in a conventional electronic device when a screen 30 is pressed or a pressing action is withdrawn from the screen 30.

Figure 5:
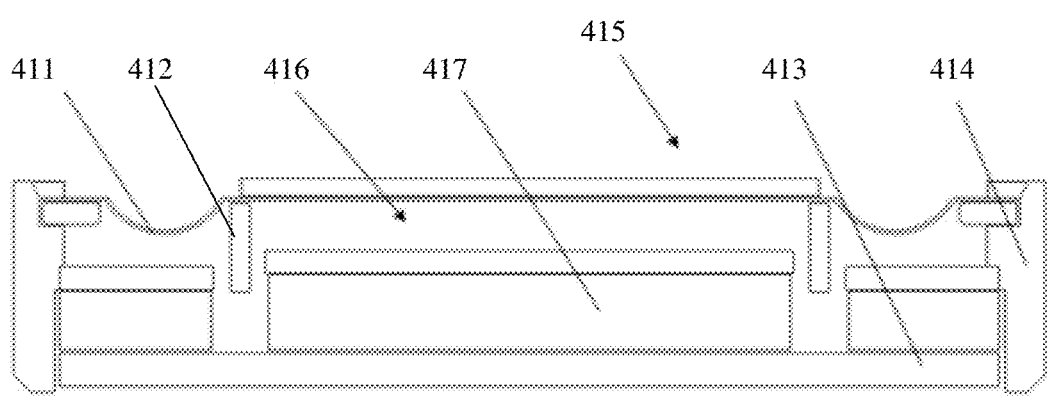
FIG. 5 is a schematic diagram of a structure of a speaker of the electronic device shown in FIG. 1.

FIG. 5 is a schematic diagram of a structure of the speaker 41 of the electronic device 100 shown in FIG. 1.

Specifically, the speaker 41 includes a diaphragm 411, a voice coil 412, lower magnetic steel 413, a bracket 414, and a magnet 417. The lower magnetic steel 413 and the diaphragm 411 are respectively fastened onto two opposite sides of the bracket 414. A rear box 416 is formed on a side that is of the diaphragm 411 and that faces the lower magnetic steel 413, and the rear box 416 is connected to the first space 70. A front box 415 is formed on a side that is of the diaphragm 412 and that faces away from the lower magnetic steel 413, and the front box 415 is connected to the outside of the electronic device 100. Pressure of the front box 415 and pressure of the rear box 416 affect a position of the diaphragm 412. The voice coil 412 is fastened onto the side that is of the diaphragm 411 and that faces the lower magnetic steel 413. The magnet 417 is fastened onto the side that is of the diaphragm 411 and that faces the lower magnetic steel 413.

Air tightness of the conventional electronic device is relatively high. For example, if the electronic device meets an IPX7 waterproof level or a higher waterproof level, when air pressure of a first space changes because the electronic device is pressed or a pressing action is withdrawn from the electronic device, it is difficult to reach a balance between air pressure of the first space and external air pressure of the electronic device.

Specifically, to clearly illustrate a change that occurs in the structure of the speaker in the conventional electronic device after pressing or a pressing action is withdrawn, for a conventional speaker structure, refer to the speaker structure in this application. In this case, a reference sign of the conventional speaker is the same as the reference sign of the speaker in this application. When the conventional electronic device is pressed, air pressure of the first space is greater than external air pressure of the electronic device, and consequently a diaphragm 411 of the speaker 41 in the first space upward displaces. When a pressing action is withdrawn, air pressure of the first space is less than external air pressure of the electronic device, and consequently the diaphragm 411 of the speaker 41 downward displaces. When the diaphragm 411 of the speaker 41 upward displaces, a voice coil 412 of the speaker 41 exceeds a region with maximum magnetic field strength, and therefore an amplitude of the diaphragm 411 decreases and a sound of the speaker 41 decreases. When the diaphragm 411 of the speaker 41 downward displaces, because the voice coil 412 of the speaker 41 is still in the region with the maximum magnetic field strength, a sound level of the speaker 41 does not change. However, because a downward-vibration space of the voice coil 412 of the speaker 41 decreases, the voice coil 412 is prone to be in contact with lower magnetic steel 413 of the speaker 41 or rub against a magnet 417 in the speaker 41 due to a vibration imbalance, causing noise in the speaker 41. In short, after the conventional electronic device is pressed or a pressing action is withdrawn from the conventional electronic device, because it is difficult to implement a quick balance between air pressure of the first space 70 of the conventional electronic device and external air pressure of the conventional electronic device, it is prone to cause an imbalance between air pressure of a front box 415 and air pressure of a rear box 416 of an audio component such as the speaker 41, and consequently the audio component cannot normally work.

In addition, when a user applies pressure to a housing in a direction perpendicular to a thickness of the housing or quickly withdraws a pressing action, because it is more difficult to quickly balance air pressure of the first space of the conventional electronic device with external air pressure of the conventional electronic device, it is extremely prone to cause a severe imbalance between air pressure of the front box 415 and air pressure of the rear box 416 of the audio component 40 such as the speaker 41, and consequently the audio component cannot normally work.

The foregoing specifically describes, with reference to FIG. 5, the case in which the audio component 40 cannot normally work because it is difficult to balance air pressure of the first space 70 of the conventional electronic device 100 with external air pressure of the electronic device 100. The following specifically describes, with reference to related accompanying drawings, the decorating assembly 12 and the housing assembly 10 that can quickly balance air pressure of the first space 70 with external air pressure of the electronic device 100. The following specifically describes a decorating assembly 12 of a first structure with reference to related accompanying drawings.

Figure 6:
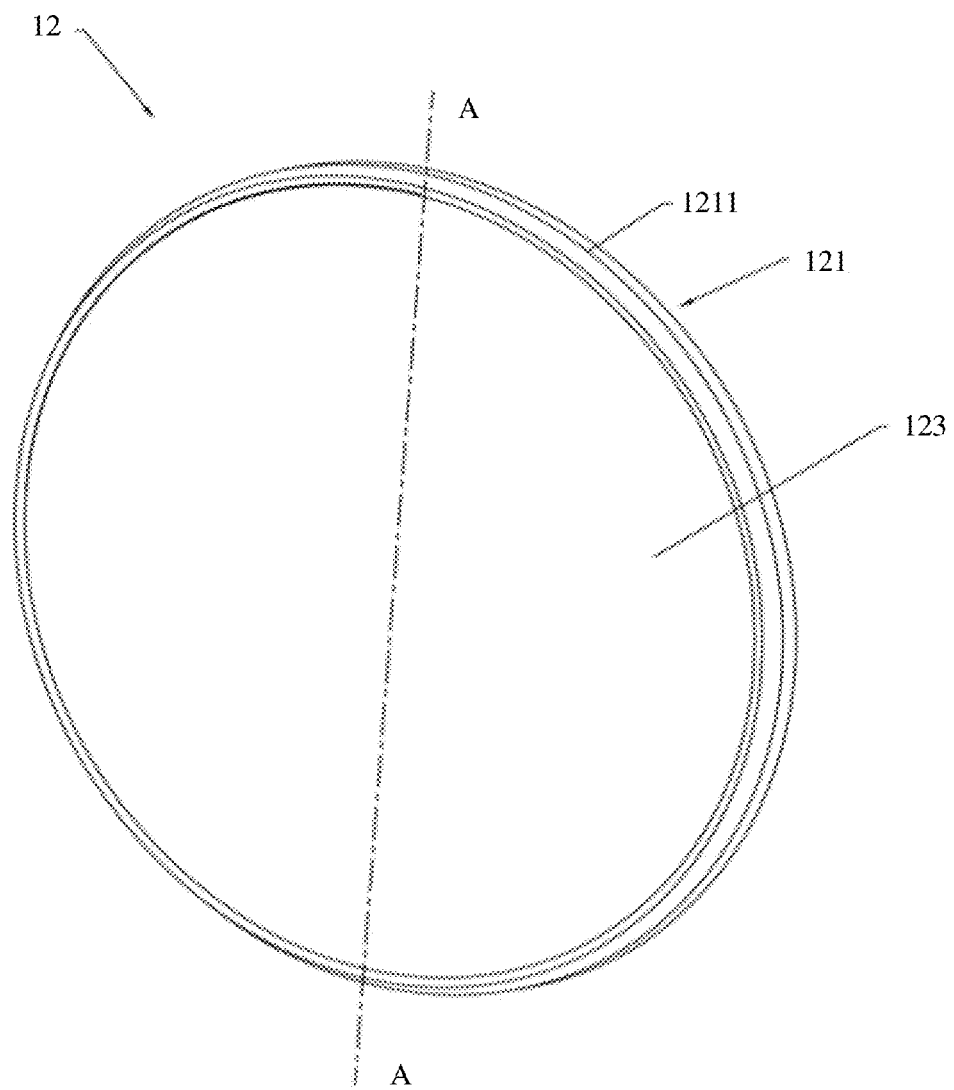
FIG. 6 is a schematic diagram of a structure of an implementation of a decorating assembly of the electronic device shown in FIG. 1.
Figure 7:
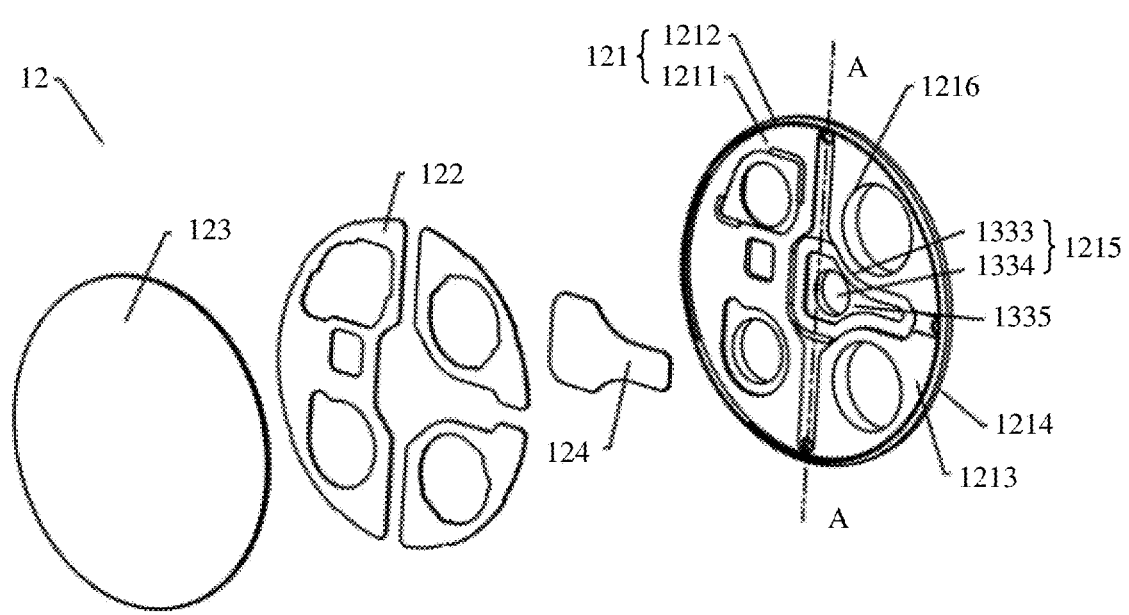
FIG. 7 is a schematic exploded diagram of the decorating assembly shown in FIG. 6.

FIG. 6 is a schematic diagram of a structure of an implementation of the decorating assembly 12 of the electronic device 100 shown in FIG. 1. FIG. 7 is a schematic exploded diagram of the decorating assembly 12 shown in FIG. 6.

The decorating assembly 12 includes a decorating part 121, a first adhesive layer 122, and a cover 123. A shape of the decorating assembly 12 is not limited to only a disc shape shown in FIG. 6.

It may be understood that the decorating assembly 12 is a separate component, in other words, the decorating assembly 12 is of an integral structure. In this case, in an assembling process of the housing assembly 10, first, the decorating part 121, the first adhesive layer 122, and the cover 123 may be assembled into the decorating assembly 12, namely, an integral assembly, and then, the decorating assembly 12 may be fastened to the housing 11. Clearly, compared with a solution in which the decorating part 121 and the cover 123 are separately assembled onto the housing 11, in this implementation, the integral decorating assembly 12 is assembled onto the housing 11, so that the assembling process is simple and has a low difficulty coefficient. Therefore, in this implementation, the decorating part 121, the first adhesive layer 122, and the cover 123 are disposed as the integral decorating assembly 12, so that an assembling step of the housing assembly 10 can be simplified, and assembling difficulty can be reduced.

As shown in FIG. 7, the decorating part 121 includes a base 1211 and a decorating ring 1212.

A shape of the base 1211 is not limited to only a disc shape shown in FIG. 7. In another implementation, the shape of the base 1211 may be alternatively a square or another irregular graph. This is not limited in this application.

Figure 8:
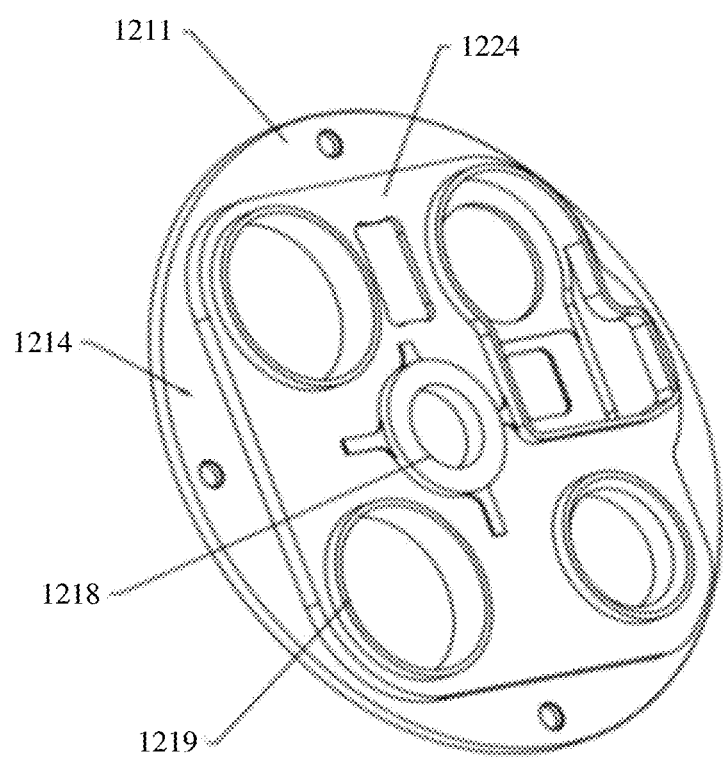
FIG. 8 is a schematic diagram of a structure of a decorating part of the decorating assembly shown in FIG. 6.

The base 1211 includes a first surface 1213 and a second surface 1214 that are oppositely disposed (FIG. 8 shows the second surface 1214 at another angle). With reference to FIG. 4, the first surface 1213 is a surface of a side that is of the base 1211 and that faces away from the housing 11. The second surface 1214 is a surface of a side that is of the base 1211 and that faces the housing 11. A part of the second surface 1214 is connected to the first face 11 of the housing 11. In this case, the second adhesive layer 13 is located between the second surface 1214 and the first face 11.

In addition, a breathable space 1215 is disposed in the base 1211. The breathable space 1215 penetrates from the first surface 1213 to the second surface 1214, and the breathable space 1215 is not limited to only an odd-form hole shown in FIG. 7. The breathable space 1215 may be alternatively of another shape, for example, an elliptical hole or a square hole. In addition, a quantity of breathable spaces 1215 is not limited to only 1 shown in FIG. 7. For example, the quantity of breathable spaces 1215 may be alternatively greater than 1.

In addition, the decorating assembly 12 further includes a waterproof breathable film 124. The waterproof breathable film 124 can implement gas permeation and liquid blocking. The waterproof breathable film 124 is installed on the base 1211, and the waterproof breathable film 124 covers the breathable space 1215. In this case, gas can permeate from one side of the waterproof breathable film 124 to the other side. However, liquid is blocked by the waterproof breathable film 124, in other words, external liquid of the electronic device 100 cannot permeate from one side of the waterproof breathable film 124 to the other side. It may be understood that the waterproof breathable film 124 may be connected to the first surface 1213 through fastening, may be connected to the second surface 1214 through fastening, or may be connected in the breathable space 1215 through fastening.

In an implementation, the breathable space 1215 includes a groove 1333 and a first through hole 1334. An opening of the groove 1333 is located on the first surface 1213. The first through hole 1334 penetrates from a bottom wall 1335 of the groove 1333 to the second surface 1214. In this case, the waterproof breathable film 124 is connected to the bottom wall 1335 of the groove 1333 through fastening by using an adhesive. In another implementation, the waterproof breathable film 124 may be alternatively connected to the bottom wall 1335 of the groove 1333 in a fastening manner such as snap-fitting.

In addition, a first penetrating hole 1216 may be further disposed in the base 1211. The first penetrating hole 1216 penetrates from the first surface 1213 to the second surface 1214. The first penetrating hole 1216 is not limited to only a circular hole shown in FIG. 7. The first penetrating hole 1216 may be alternatively of another shape, for example, an elliptical hole or a square hole. A quantity of first penetrating holes 1216 is not limited to only 4 shown in FIG. 7. For example, the quantity of first penetrating holes 1216 may be alternatively 1, 2, or 3, or greater than 4.

Refer to FIG. 7 again. The decorating ring 1212 protrudes from the first surface 1213. In an implementation, the decorating ring 1212 is integrally formed with the base 1211. In another implementation, the decorating ring 1212 may be alternatively connected to the base 1211 through fastening in a connection manner such as welding or screw locking. In addition, the decorating ring 1212 is not limited to only an annular structure shown in FIG. 7.

In addition, the decorating ring 1212 is disposed around a peripheral edge of the base 1211. In this case, both the breathable space 1215 and the first penetrating hole 1216 are located inside the decorating ring 1212, in other words, the decorating ring 1212 is disposed around the breathable space 1215 and the first penetrating hole 1216.

In an implementation, an outer side face of the decorating ring 1212 is smoothly connected to a peripheral side face of the base 1211. In this case, appearance consistency of the decorating assembly 12 is relatively good.

FIG. 8 is a schematic diagram of a structure of the decorating part 121 of the decorating assembly 12 shown in FIG. 6.

The decorating part 121 further includes a positioning plate 1224. The positioning plate 1224 protrudes from the second surface 1214. It may be understood that when the decorating part 121 includes the positioning plate 1224, structural strength and stability of the decorating part 121 are better. In addition, when a user applies pressure to the decorating assembly 12, the decorating part 121 having the positioning plate 1224 can further assist the decorating assembly 12 in better supporting a pressing force of the user.

In an implementation, the positioning plate 1224 is integrally formed with the base 1211. In another implementation, the positioning plate 1224 may be alternatively connected to the base 1211 through fastening in a connection manner such as welding or screw locking.

In addition, a fourth through hole 1218 is disposed in the positioning plate 1224. With reference to FIG. 7, the fourth through hole 1218 is connected to the breathable space 1215, in other words, the fourth through hole 1218 and the breathable space 1215 are connected to each other.

A quantity of fourth through holes 1218 is not limited to only 1 shown in FIG. 8. The quantity of fourth through holes 1218 may be alternatively greater than 1. In this case, a plurality of fourth through holes 1218 are all connected to the breathable space 1215.

In an implementation, when there is one fourth through hole 1218 and there is also one breathable space 1215, the fourth through hole 1218 and the first through hole 1334 are just disposed face to face, so that the fourth through hole 1218 and the first through hole 1334 form an integral through hole. In addition, when there are a plurality of fourth through holes 1218 and there are also a plurality of breathable spaces 1215, the plurality of fourth through holes 1218 are disposed in a one-to-one correspondence with the plurality of breathable spaces 1215, and each fourth through hole 1218 and each first through hole 1334 form one integral through hole.

In addition, a second penetrating hole 1219 is disposed in the positioning plate 1224. With reference to FIG. 7, the second penetrating hole 1219 is connected to the first penetrating hole 1216. The second penetrating hole 1219 is not limited to only a circular hole shown in FIG. 8. The second penetrating hole 1219 may be alternatively of another shape, for example, an elliptical hole or a square hole. In addition, a quantity of second penetrating holes 1219 is not limited to only 4 shown in FIG. 8. For example, the quantity of second penetrating holes 1219 may be alternatively 1, 2, or 3, or greater than 4.

In an implementation, four second penetrating holes 1219 are disposed in a one-to-one correspondence with four first penetrating holes 1216, and each penetrating hole 1216 and each penetrating hole 1216 form one integral penetrating hole.

Figure 9:
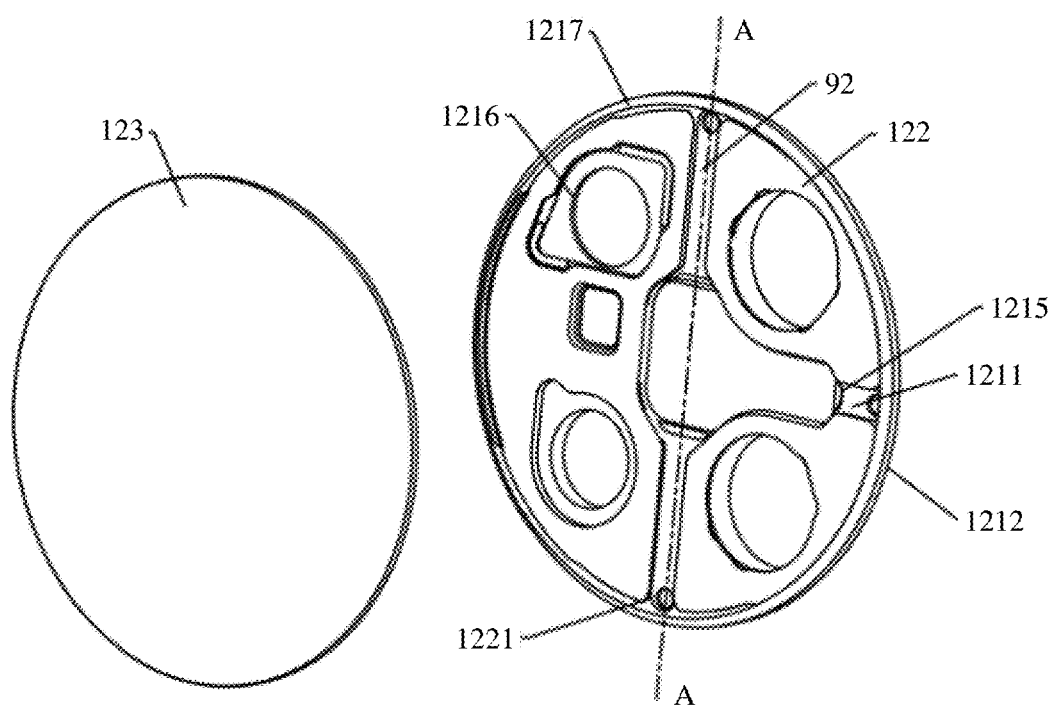
FIG. 9 is a partial schematic exploded diagram of the decorating assembly shown in FIG. 6, where a first adhesive layer is connected to a base through fastening.

FIG. 9 is a partial schematic exploded diagram of the decorating assembly 12 shown in FIG. 6, where the first adhesive layer 122 is connected to the base 1211 through fastening.

The first adhesive layer 122 is connected to the first surface 1213 (refer to FIG. 7) through fastening. The first adhesive layer 122 is disposed by being staggered from the breathable space 1215, and the first adhesive layer 122 is disposed around the first penetrating hole 1216. The first adhesive layer 122 may be connected to a part of the first surface 1213 through fastening, or may be connected to all of the first surface 1213 through fastening. In addition, the first adhesive layer 122 is located inside the decorating ring 1212, in other words, the decorating ring 1212 is disposed around the first adhesive layer 122.

In an implementation, a distance between the first adhesive layer 122 and an edge of the breathable space 1215 is greater than or equal to 0.8 millimeters. In this case, in a process of forming the first adhesive layer 122 on the first surface 1213, the first adhesive layer 122 does not block the breathable space 1215 because of flowing into the breathable space 1215. Similarly, a distance between the first adhesive layer 122 and an edge of the first penetrating hole 1216 is greater than or equal to 0.8 millimeters.

Refer to FIG. 9 again. The first adhesive layer 122 forms a first channel 92 connected to the breathable space 1215. A quantity of first channels 92 is not limited to only 3 shown in FIG. 9, and the quantity of first channels 92 may be alternatively 1 or 2, or greater than 3. In addition, the waterproof breathable film 124 may be alternatively disposed in the first channel 92. In this case, gas can permeate through the waterproof breathable film 124, to flow in a first gap S, the first channel 92, and the breathable space 1215. In addition, external liquid of the electronic device 100 is blocked by the waterproof breathable film 124.

In addition, the cover 123 is connected, through fastening, to a surface that is of the first adhesive layer 122 and that faces away from the base 1211. In this case, the first adhesive layer 122 is located between the cover 123 and the base 1211. In addition, with reference to FIG. 6, the cover 123 is located inside the decorating ring 1212, in other words, the decorating ring 1212 is disposed around the cover 123.

In addition, a material of the cover 123 may be but is not limited to only a glass material. For example, the material of the cover 123 may be alternatively a plastic material.

In addition, the cover 123 covers the breathable space 1215 and the first penetrating hole 1216, in other words, projections of the breathable space 1215 and the first penetrating hole 1216 on the cover 123 are both located on the cover 123.

It may be understood that because the first adhesive layer 122 is disposed around the first penetrating hole 1216 and the cover 123 covers the first penetrating hole 1216, the periphery of the first penetrating hole 1216 is approximately sealed by the first adhesive layer 122 and the cover 123. In this case, external liquid of the electronic device 100 does not flow into the first penetrating hole 1216.

In an implementation, the cover 123 covers the first adhesive layer 122.

The foregoing specifically describes, with reference to FIG. 9, the case in which the cover 123, the first adhesive layer 122, and the decorating part 121 form an integral when the cover 123 is connected to the decorating part 121 through fastening by using the first adhesive layer 122.

Figure 10:
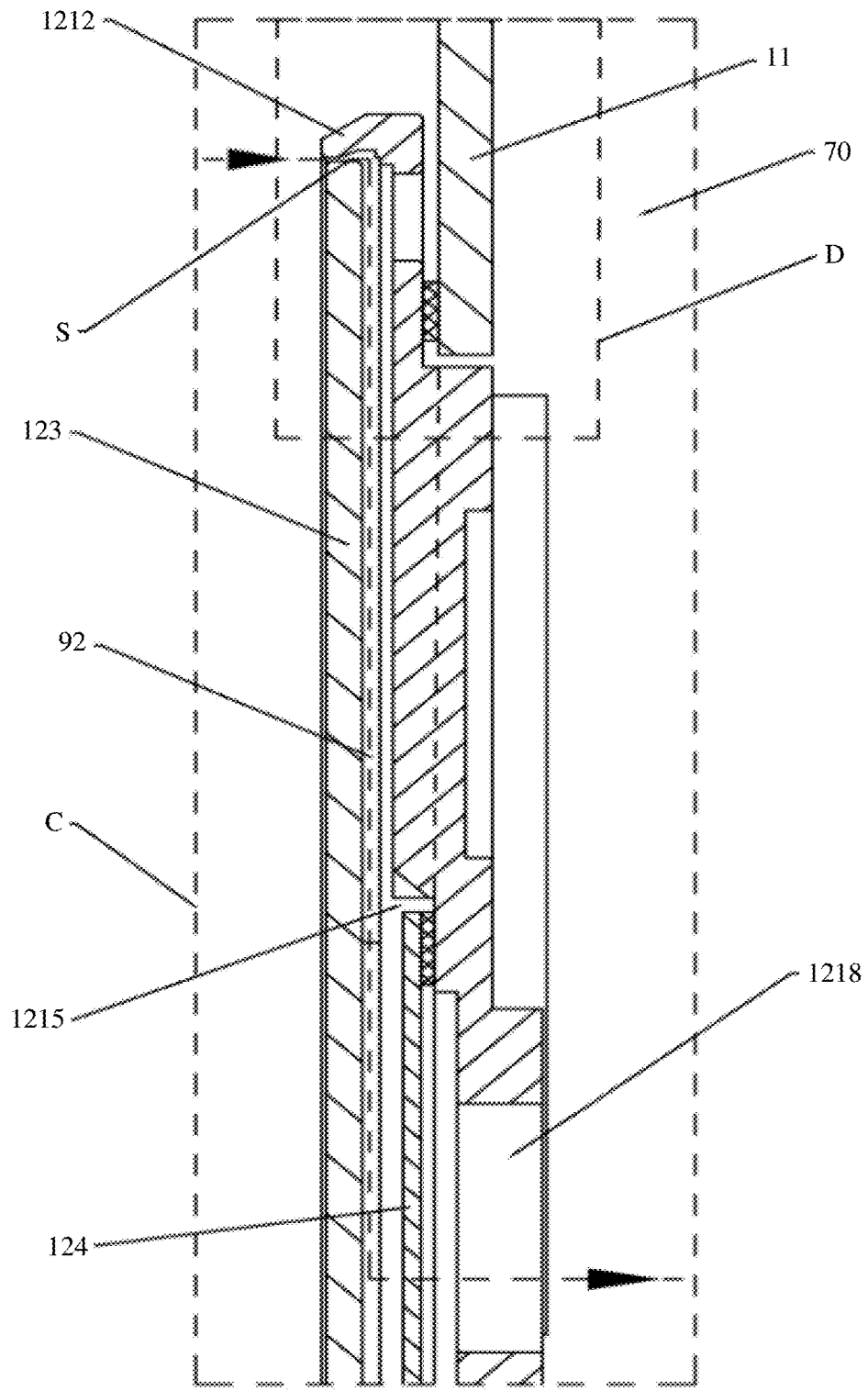
FIG. 10 is a schematic enlarged diagram of a position C of the electronic device shown in FIG. 3.

FIG. 10 is a schematic enlarged diagram of a position C of the electronic device 100 shown in FIG. 3. FIG. 11(*a*) is a schematic enlarged diagram of a position D of the electronic device 100 shown in FIG. 10.

The first gap S is formed between a peripheral side face 1231 of the cover 123 and an inner side face 1217 of the decorating ring 1212. The first gap S is a gap reserved when the cover 123 is installed on the decorating part 121. In this case, a size of the first gap S is easily controlled. Certainly, in another implementation, the first gap S may be alternatively a gap that exists between the cover 123 and the decorating ring 1212 due to an installation tolerance. It may be understood that the first channel 92 is connected to the first gap S and the breathable space 1215. FIG. 10 and FIG. 11(*a*) briefly illustrate, by using dashed lines and arrows, that the first gap S is connected to the breathable space 1215 through the first channel 92.

It may be understood that because both the cover 123 and the decorating ring 1212 are located outside the electronic device 100, the first gap S is connected to the outside of the electronic device 100. In this case, the breathable space 1215 is connected to the outside of the electronic device 100 through the first channel 92 and the first gap S. Therefore, external gas of the electronic device 100 can be transmitted to the breathable space 1215 through the first gap S and the first channel 92.

In addition, FIG. 11(*b*) is a diagram of a gas flowing path of the decorating assembly 12 shown in FIG. 6. After gas enters the first gap S, the gas can enter the breathable space 1215 along three first channels 92 shown in FIG. 11(*b*) by using broken lines. Certainly, in another embodiment, a quantity of first channels 92 may be alternatively another value.

Refer to FIG. 10 and FIG. 11(*a*) again. The positioning plate 1224 extends into the first space 70 through the third through hole 113 of the housing 11. The base 1211 is exposed relative to the third through hole 113.

In an implementation, a peripheral side face of the positioning plate 1224 is in contact with a wall of the third through hole 113, so that firmness of connection between the decorating assembly 12 and the housing 11 is better, thereby improving structural strength and stability of the housing 11 assembly. In another implementation, gap fit may be alternatively implemented between a peripheral side face of the positioning plate 1224 and a wall of the third through hole 113.

Because the positioning plate 1224 extends into the first space 70 through the third through hole 113, the breathable space 1215 is connected to the first space 70 through the fourth through hole 1218. The first penetrating hole 1216 is connected to the first space 70 through the second penetrating hole 1219.

It may be understood that when the breathable space 1215 is connected to the first space 70 through the fourth through hole 1218, and the breathable space 1215 is connected to the outside of the electronic device 100 through the first channel 92 and the first gap S, the first space 70 is connected to the outside of the electronic device 100 through the fourth through hole 1218, the breathable space 1215, the first channel 92, and the first gap S. Therefore, external gas of the electronic device 100 flows along the following path, in other words, a first path provided in this application, so that the external gas of the electronic device 100 enters the first space 70. FIG. 10 and FIG. 11(*a*) approximately illustrate the first path by using dashed lines and arrows. The first path is specifically "the outside of the electronic device 100—the first gap S—the first channel 92—the breathable space 1215—the waterproof breathable film 124—the fourth through hole 1218—the first space 70".

In addition, gas in the first space 70 can flow out of the electronic device 100 in a reverse direction of the first path.

In addition, because the waterproof breathable film 124 is installed on the base 1211, and the waterproof breathable film 124 covers the breathable space 1215, external liquid of the electronic device 100 is blocked by the waterproof breathable film 124. Therefore, the external liquid of the electronic device 100 flows along the following path. A specific path is "the outside of the electronic device 100—the first gap S—the first channel 92—the breathable space 1215—the waterproof breathable film 124".

It may be understood that the waterproof breathable film 124 may be disposed in the first path to prevent external liquid from entering the electronic device along the flowing path of the external gas, and is not limited to being fastened onto the first surface 1213 or the second surface 1214.

In this embodiment, when the screen 30 or the housing 11 of the electronic device 100 is pressed, the first space 70 decreases, and air pressure of the first space 70 increases. In this case, gas in the first space 70 flows out of the electronic device 100 through the fourth through hole 1218, the waterproof breathable film 124, the breathable space 1215, the first through channel 92, and the first gap S, so that air pressure of the first space 70 decreases to be same as external air pressure of the electronic device 100. In addition, the rear box 416 of the audio component 40 disposed in the first space 70 is connected to the first space 70. Therefore, air pressure of the rear box 416 of the audio component 40 can also decrease to be same as the external air pressure of the electronic device 100. In addition, because the front box 415 of the audio component 40 is connected to the outside of the electronic device 100, a balance can be quickly reached between air pressure of the front box 415 and air pressure of the rear box 416 of the audio component 40, so that the audio component 40 can normally work.

After a pressing action is withdrawn, the first space 70 increases, and air pressure of the first space 70 decreases. In this case, external gas of the electronic device 100 enters the first space 70 through the first gap S, the first channel 92, the breathable space 1215, the waterproof breathable film 124, and the fourth through hole 1218, so that air pressure of the first space 70 increases to be the same as external air pressure of the electronic device 100. In addition, the rear box 416 of the audio component 40 disposed in the first space 70 is connected to the first space 70. Therefore, air pressure of the rear box 416 of the audio component 40 can also increase to be same as the external air pressure of the electronic device 100. In addition, because the front box 415 of the audio component 40 is connected to the outside of the electronic device 100, a balance can be quickly reached or kept between air pressure of the front box 415 and air pressure of the rear box 416 of the audio component 40, so that the audio component 40 can normally work.

It may be understood that, when the housing assembly 10 having the decorating assembly 12 is applied to the electronic device 100, gas flows between the outside of the electronic device 100, the first gap S, the first channel 92, the breathable space 1215, the waterproof breathable film 124, the fourth through hole 1218, and the first space 70 to implement a quick balance between internal air pressure of the first space 70 and external air pressure of the electronic device 100, to quickly reach a balance between air pressure of the front box 415 and air pressure of the rear box 416 of the audio component 40 accommodated in the first space 70, so that the audio component 40 normally works.

Figure 11A:
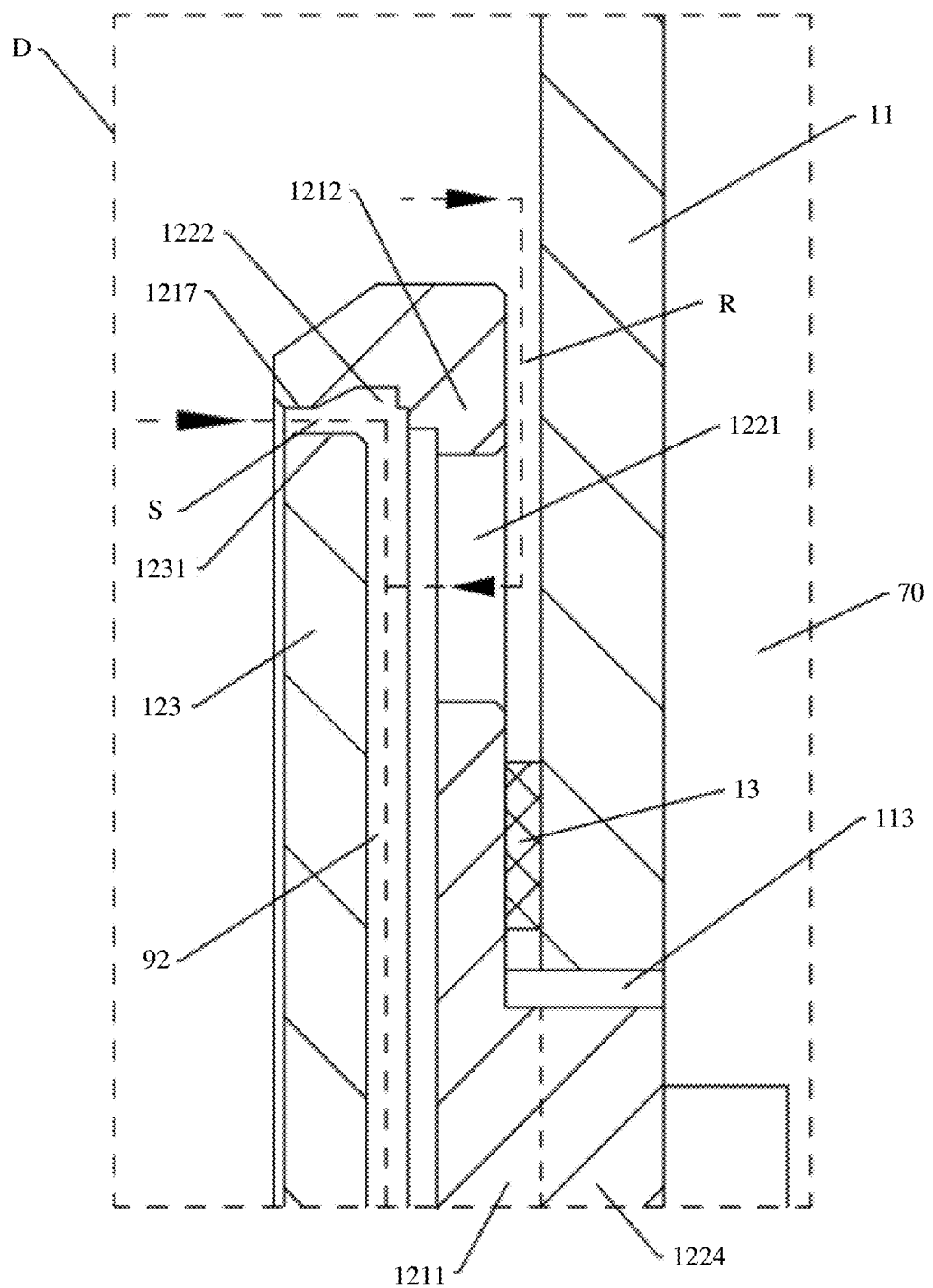
FIG. 11(a) is a schematic enlarged diagram of a position D of the electronic device shown in FIG. 10.

Refer to FIG. 11(a) again. A second gap R is formed between the base 1211 and the housing 11, in other words, the second gap R is formed between the second surface 1214 and the first face 11. The second gap R is connected to the outside of the housing assembly 10, in other words, external gas of the electronic device 100 can enter the second gap R.

Refer to FIG. 11(a). A second through hole 1221 is disposed in the base 1211. The second through hole 1221 penetrates through the first surface 1213 and the second surface 1214. The second through hole 1221 is located between the inside of the decorating ring 1212 and the second adhesive layer 13. The second through hole 1221 connects the second gap R to the first channel 92, in other words, external gas of the electronic device 100 can flow into the first channel 92 through the second gap R and the second through hole 1221. The second through hole 1221 may be but is not limited to only a circular hole. For example, the second through hole 1221 may be alternatively an odd-form hole or a square hole.

Figure 11B:
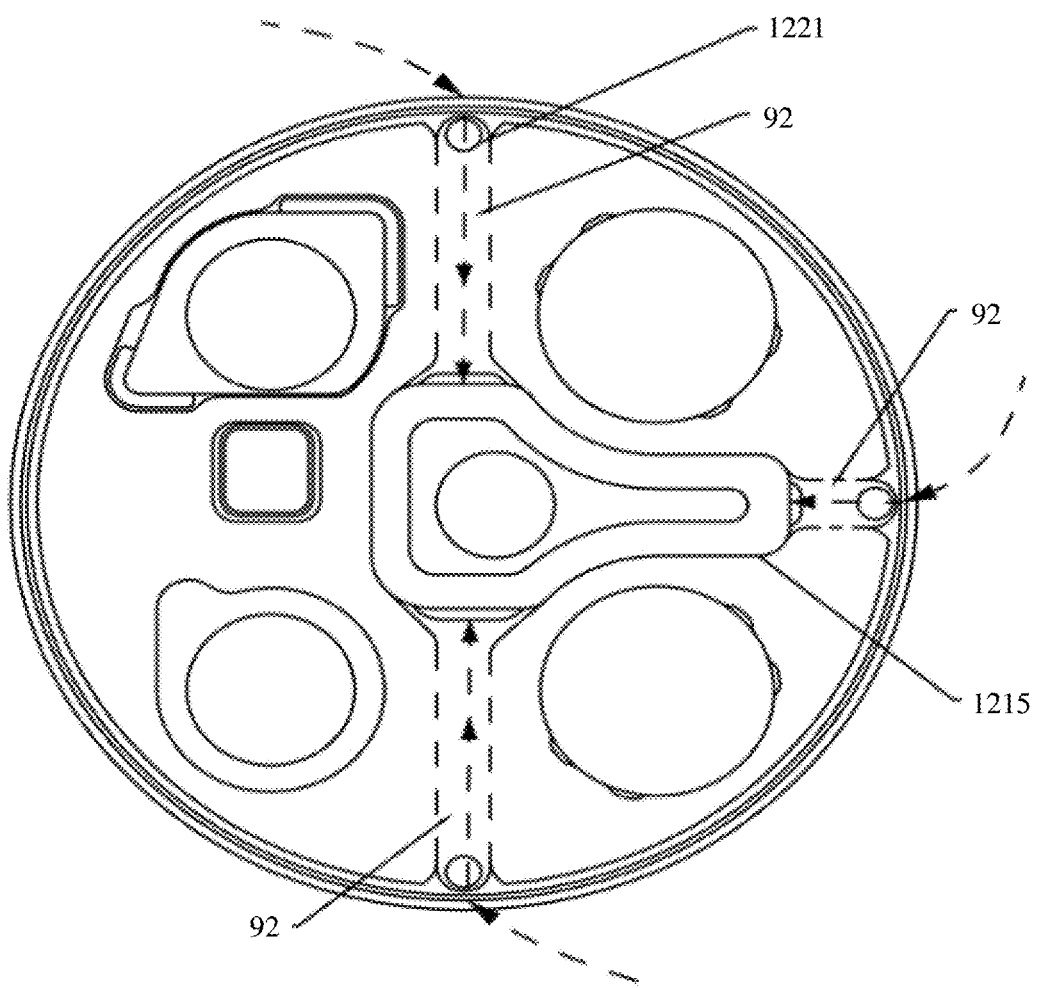
FIG. 11(b) is a diagram of a gas flowing path of the decorating assembly shown in FIG. 6.

In an implementation, with reference to FIG. 11(b), the second through hole 1221 just faces the first channel 92, in other words, an opening of the second through hole 1221 is located in the first channel 92, to prevent costs of the decorating assembly 12 from being increased because an additional connection hole for connecting the second through hole 1221 to the first channel 92 is opened. The second through hole 1221 is just located on a cross-sectional line. FIG. 11(b) shows that there are three second through holes 1221. The three second through holes 1221 respectively just face the three first channels 92. It may be understood that a quantity of second through holes 1221 may be alternatively another value. This is not limited in this application.

Refer to FIG. 10 and FIG. 11(a). It may be understood that, because the first channel 92 is connected to the first space 70 through the breathable space 1215 and the fourth through hole 1218, the outside of the electronic device 100 may also be connected to the first space 70 through the second gap R, the second through hole 1221, the first channel 92, the breathable space 1215, and the fourth through hole 1218. In this case, external gas of the electronic device 100 can enter the first space 70 of the electronic device 100 along the following second path. The second path is specifically "the outside of the electronic device 100—the second gap R—the second through hole 1221—the first channel 92—the breathable space 1215—the waterproof breathable film 124—the fourth through hole 1218—the first space 70".

The waterproof breathable film 124 may be disposed in the second path to prevent external liquid from entering the electronic device along the flowing path of the external gas, and is not limited to being fastened onto the first surface 1213 or the second surface 1214.

The waterproof breathable film 124 may be disposed in a common path part of the first path and the second path to prevent external liquid from entering the electronic device along the flowing path of the external gas and is not limited to being fastened onto the first surface 1213 or the second surface 1214.

In addition, gas in the first space 70 can also flow out of the electronic device 100 in a reverse direction of the second path, and specifically, along "the first space 70—the fourth through hole 1218—the waterproof breathable film 124— the breathable space 1215—the first channel 92—the second through hole 1221—the second gap R—the outside of the electronic device 100".

In addition, when external liquid of the electronic device 100 flows through the second gap R, the liquid does not enter the first space 70 through the third through hole 113 because the liquid is blocked by the second adhesive layer 13. In this case, a specific flowing path of the external liquid of the electronic device 100 is "the outside of the electronic device 100—the second gap R".

When enough external liquid of the electronic device 100 flows through the second gap R, the liquid enters the first channel 92 through the second through hole 1221. In this case, because the waterproof breathable film 124 is disposed on the breathable space 1215, the liquid is blocked by the waterproof breathable film 124. In this case, a specific flowing path of the external liquid of the electronic device 100 is "the outside of the electronic device 100—the second gap R—the second through hole 1221—the first channel 92—the breathable space 1215—the waterproof breathable film 124".

It may be understood that when the screen 30 or the housing 11 of the electronic device 100 is pressed, the first space 70 decreases, and air pressure of the first space 70 increases. In this case, when gas in the first space 70 can be transmitted to the outside of the electronic device 100 along the first path, the gas in the first space 70 can be further transmitted to the outside of the electronic device 100 along the second path, so that air pressure of the first space 70 further quickly decreases to be the same as external air pressure of the electronic device 100, and then air pressure of the rear box 416 of the audio component 40 can also quickly decrease to be the same as the external air pressure of the electronic device 100, so that a balance can be quickly reached between air pressure of the front box 415 and air pressure of the rear box 416 of the audio component 40, so that the audio component 40 normally works.

In addition, when a pressing action is withdrawn, the first space 70 increases, and air pressure of the first space 70 decreases. In this case, when external gas of the electronic device 100 flows into the first space 70 along the first path, the external gas of the electronic device 100 can further flows into the first space 70 through the second path, so that air pressure of the first space 70 further increases to be the same as external air pressure of the electronic device 100, and then air pressure of the rear box 416 of the audio component 40 can also increase to be the same as the external air pressure of the electronic device 100, so that a balance can be quickly reached or kept between air pressure of the front box 415 and air pressure of the rear box 416 of the audio component 40, so that the audio component 40 can normally work.

It may be understood that, when the housing assembly 10 having the decorating assembly 12 is applied to the electronic device 100, gas flows along the second path to implement a further quick balance between air pressure of the first space 70 and external air pressure of the electronic device 100, to further quickly reach a balance between air pressure of the front box 415 and air pressure of the rear box 416 of the audio component 40 accommodated in the first space 70, so that the audio component 40 normally works.

In addition, the second gap R and the second through hole 1221 in the second path are located in a position with which a hand of a user is not prone to be in contact. In this case, sweat or an oil stain on the hand of the user is not prone to block the second gap R or the second through hole 1221 because of staying at the second gap R or the second through hole 1221, to ensure that the second path is always in a smooth state, and then ensure that air pressure of the front box 415 and air pressure of the rear box 416 of the audio component 40 are always in a balanced state, so that the audio component 40 is always in a normal working state.

Figure 12:
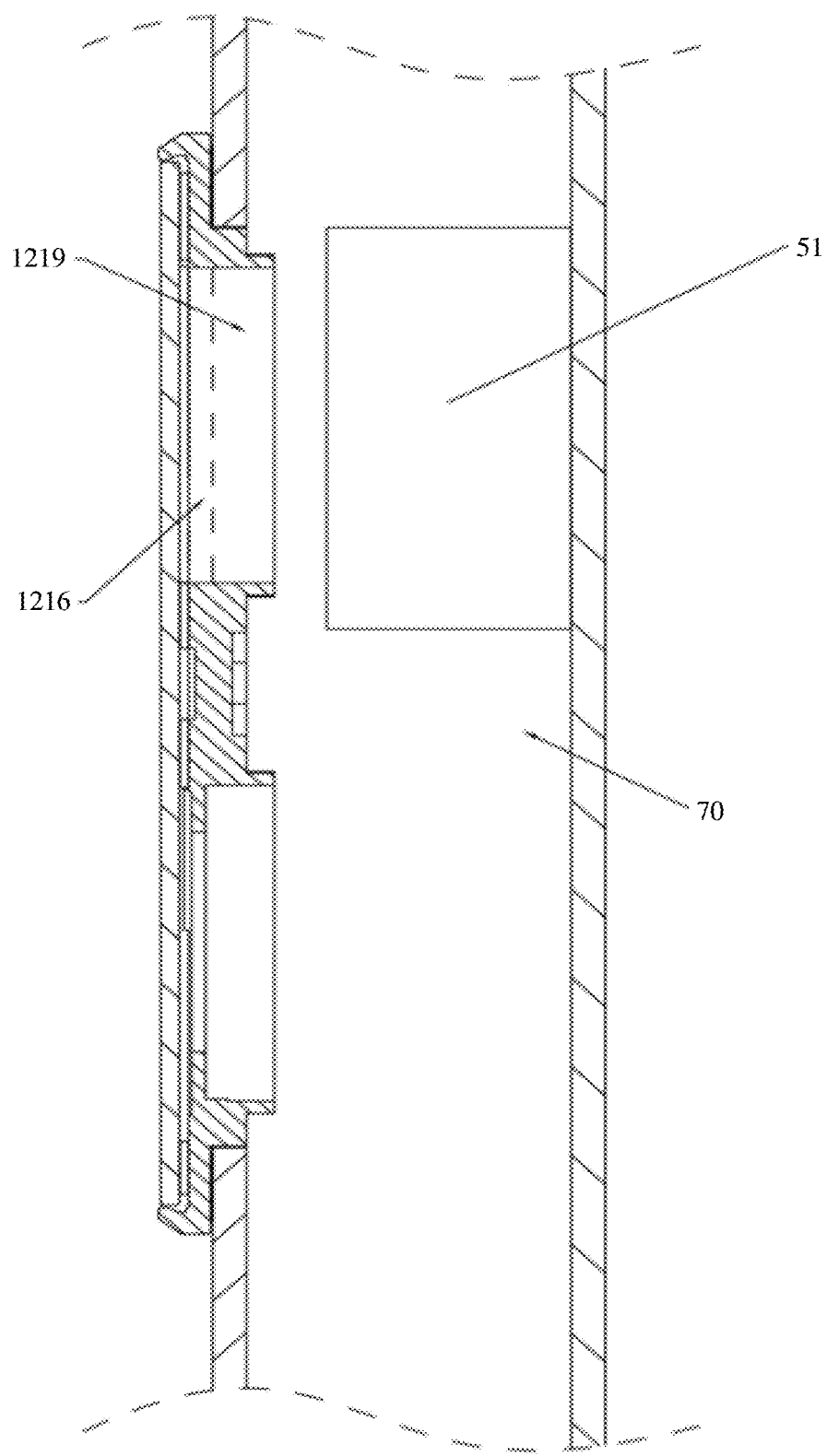
FIG. 12 is a schematic cross-sectional diagram of the electronic device shown in FIG. 1 at a line N-N.

FIG. 12 is a schematic cross-sectional diagram of the electronic device 100 shown in FIG. 1 at a line N-N.

When the first penetrating hole 1216 is connected to the first space 70 through the second penetrating hole 1219, the photographing module 51 can collect external ambient light of the electronic device 100 through the first penetrating hole 1216 and the second penetrating hole 1219. In FIG. 12, the first penetrating hole 1216 is separated from the second penetrating hole 1219 by using a dashed line.

Specifically, it may be learned from the foregoing, FIG. 7, and FIG. 8 that the quantity of first penetrating holes 1216 and the quantity of second penetrating holes 1219 are both 4. In this case, a quantity of photographing modules 51 may also be 4. One photographing module 51 just faces one first penetrating hole 1216 and one second penetrating hole 1219. In this case, ambient light propagates into the first space 70 through the following path. A specific path is "the outside of the electronic device 100—the first penetrating hole 1216—the second penetrating hole 1219—the first space 70".

In another implementation, when one of the photographing modules 51 is replaced with a camera flash 52, the camera flash 52 can also emit light through the first penetrating hole 1216 and the second penetrating hole 1219. The light emitted by the camera flash 52 propagates to the outside of the electronic device 100 along the following path. A specific path is "the first space 70—the second penetrating hole 1219—the first penetrating hole 1216—the outside of the electronic device 100".

It may be understood that the decorating assembly 12 can be used to quickly balance internal and external air pressure of the electronic device 100 to ensure that the audio component 40 disposed in the first space 70 can be in the normal working state, and can also provide a transparent part for the photographing module 51, so that the photographing module 51 can collect external light of the electronic device 100 by using the decorating assembly 12. Therefore, the decorating assembly 12 in this implementation has a "one for two uses" function, in other words, component utilization of the electronic device 100 is relatively high.

Figure 13:
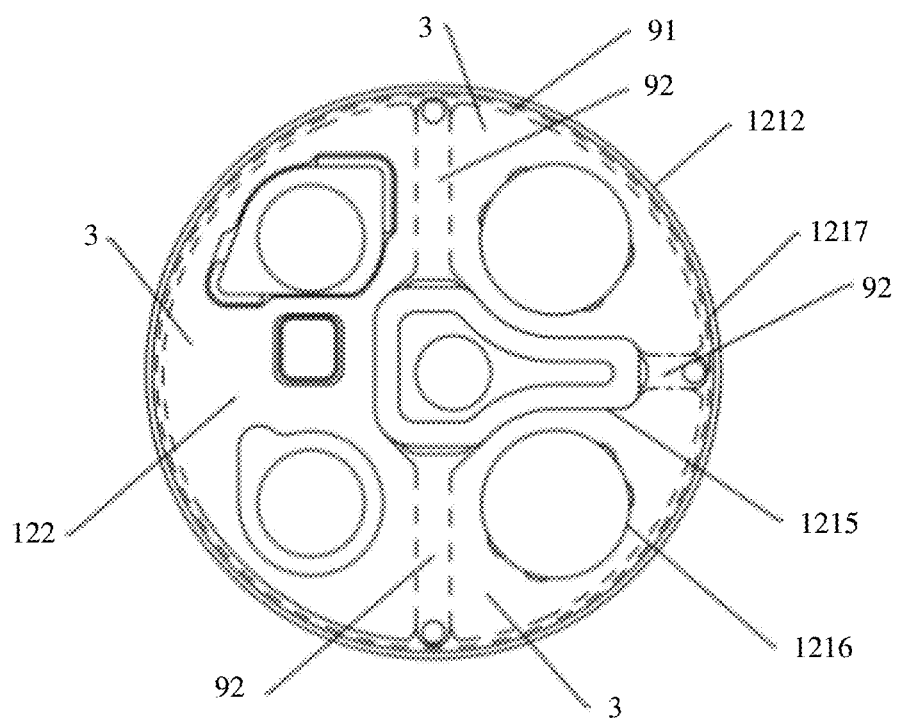
FIG. 13 is a schematic diagram of a structure of another implementation of a decorating assembly of the electronic device shown in FIG. 1.

FIG. 13 is a schematic diagram of a structure of another implementation of the decorating assembly of the electronic device shown in FIG. 1.

There are a plurality of first channels 92. The plurality of first channels 92 are connected to a breathable space 1215 in different directions.

It may be understood that, after external gas of the electronic device 100 enters a first gap S, the gas can enter the first channels 92 in different directions, and enter the breathable space 1215 in different directions through the first channels 92. In this case, the gas has a relatively large flowing amount and a relatively high flowing speed, so that air pressure of the first space 70 can be quickly balanced with external air pressure of the electronic device 100. Similarly, after gas in the first space 70 is transmitted to the breathable space 1215, the gas can enter the first channels 92 in different directions, so that the gas quickly enters the first gap S in different directions through the first channels 92, and flows out of the electronic device 100 through the first gap S, thereby quickly balancing air pressure of the first space 70 with external air pressure of the electronic device 100.

In addition, when a first channel 92 in one of the directions is blocked, first channels 92 in the other directions still ensure that gas flows into the breathable space 1215 through the first gap S, thereby ensuring that air pressure of the first space 70 can always be quickly balanced with external air pressure of the electronic device 100.

In another implementation, there may be alternatively one first channel 92.

In an implementation, the plurality of first channels 92 are spaced apart, to avoid a case in which because the plurality of first channels 92 are continuously spliced, a hollow region between a cover 123 and a base 121 is extremely large, and consequently connection between the cover 123 and the base 121 is not firm.

Refer to FIG. 13 again. A first adhesive layer 122 includes a plurality of spaced-apart adhesive blocks 3. A space between each two adhesive blocks 3 forms a first channel 92.

It may be understood that the first adhesive layer 122 is disposed as the plurality of spaced-apart adhesive blocks 3, so that assembling difficulty of the first adhesive layer 122 is reduced, in other words, the first adhesive layer 122 is conveniently assembled onto the base 1211. Specifically, the breathable space 1215 and a first penetrating hole 1216 are disposed in the base 1211, and the first adhesive layer 122 needs to be disposed by being staggered from the breathable space 1215, and also needs to be disposed around the first penetrating hole 1216. In this case, compared with an integral adhesive layer, the plurality of adhesive blocks 3 can be more flexibly connected to the base 1211 through fastening, so that the breathable space 1215 and the first penetrating hole 1216 can be simply dodged in an assembling process. In addition, when the first adhesive layer 122 is disposed as the plurality of spaced-apart adhesive blocks 3, space between each two adhesive blocks 3 can form a first channel 92. In other words, more adhesive blocks 3 indicate more first channels 92.

Refer to FIG. 13 again. A second channel 91 is formed between the first adhesive layer 122 and an inner side face 1217 of a decorating ring 1212. The second channel 91 is connected to the first gap S and the first channel 92. In this case, the second channel 91 is disposed around the inner side face 1217 of the decorating ring 1212, and the second channel 91 is of an intermittent annular structure. In this case, the first gap S between the cover 123 and the decorating ring 1212 can be connected to the first channel 92 to a large extent through the second channel 91.

Specifically, when the cover 123 can be accurately assembled onto the decorating ring 1212, any position of an outer side face of the cover 123 is not in contact with the inner side face 1217 of the decorating ring 1212, in other words, the first gap S between the cover 123 and the decorating ring 1212 is of a continuous annular structure. In addition, because the second channel 91 is disposed around the inner side face 1217 of the decorating ring 1212, most of the first gap S can be connected to the second channel 91. In this case, after external gas of the electronic device 100 enters the first gap S in different directions, the gas can also smoothly continue to flow into the breathable space 92 in different directions through the second channel 91, in other words, the gas can quickly flow into the first channel 92 through the first gap S, in other words, the gas relatively smoothly flows between the first gap S and the first channel 92, thereby quickly balancing air pressure of the first space 70 with external air pressure of the electronic device 100. Similarly, after gas in the first space 70 flows into the breathable space 1215, the gas can quickly enter the first gap S in different directions through the second channel 91, so that the gas can quickly flow out of the electronic device 100 through the first gap S, thereby quickly balancing air pressure of the first space 70 with external air pressure of the electronic device 100.

In addition, when the cover 123 cannot be accurately assembled onto the decorating ring 1212, at least one position of an outer side face of the cover 123 is in contact with the inner side face 1217 of the decorating ring 1212, in other words, the first gap S between the cover 123 and the decorating ring 1212 is of a non-continuous annular structure. For example, when the cover 123 is assembled onto the base 1211, the cover 123 inclines to a side or approaches a side. In this case, an inclined position of the cover 123 is in contact with the inner side face 1217 of the decorating ring 1212. In this case, there is no first gap S in a contact place between the cover 123 and the inner side face 1217 of the decorating ring 1212. In this case, the contact position between the cover 123 and the decorating ring 1212 forms an unconnected region with the first channel 92. In this case, after gas in the first space 70 flows into the second channel 91 through the breathable space 1215, because the second channel 91 is disposed around the inner side face 1217 of the decorating ring 1212, the gas can bypass the unconnected region along the second channel 91, and flow out of the electronic device 100 from a connected region between the second channel 91 and the first gap S, thereby quickly balancing air pressure of the first space 70 with external air pressure of the electronic device 100.

In this implementation, the second channel 91 is disposed around the inner side face 1217 of the decorating ring 1212, so that airflow blocking caused by blocking of a partial region of the first gap S can be avoided, thereby ensuring that air pressure of the first space 70 can still be quickly balanced with external air pressure of the electronic device 100 when assembling accuracy of the cover 123 and the decorating ring 1212 is not enough.

Figure 14A:
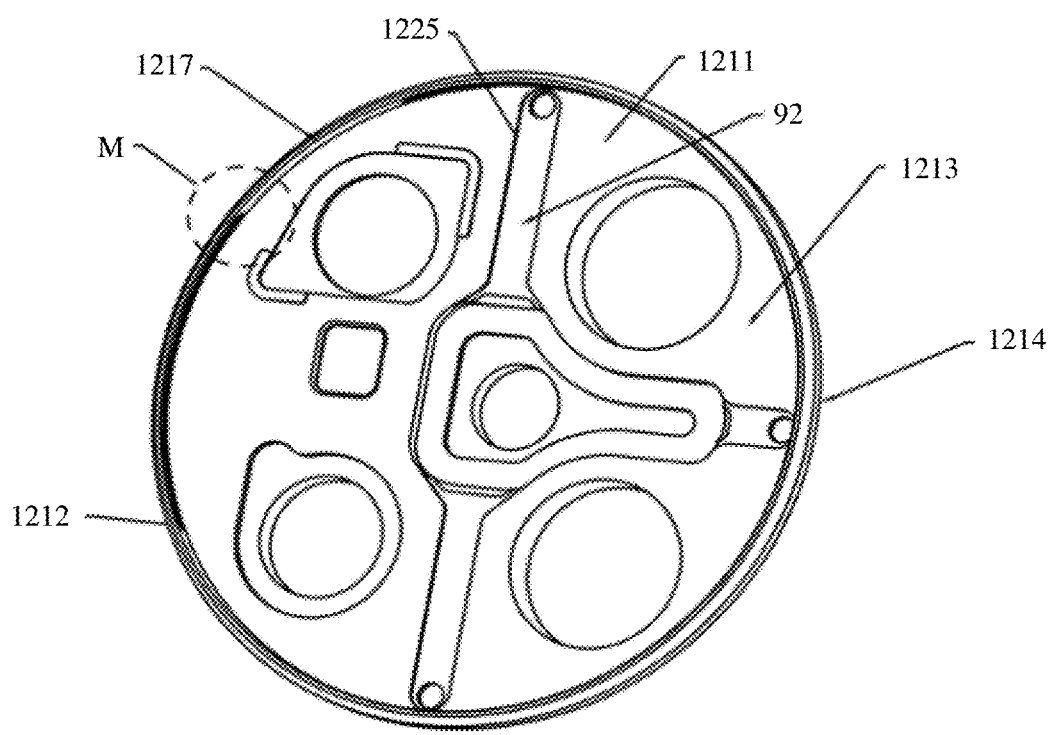
FIG. 14(a) is a schematic diagram of a structure of still another implementation of a decorating assembly of the electronic device shown in FIG. 1.

FIG. 14(a) is a schematic diagram of a structure of still another implementation of the decorating assembly 12 of the electronic device 100 shown in FIG. 1.

A first groove 1225 is disposed in a base 1211. An opening of the first groove 1225 is located on a first surface 1213, in other words, the first groove 1225 is recessed from the first surface 1213 to a second surface 1214. The first groove 1225 just faces a first channel 92 and is connected to the first channel 92. It may be understood that when the first groove 1225 is disposed in the base 1211, the first groove 1225 may significantly increase a volume of the first channel 92, in other words, more gas can circulate through the first channel 92, so that a gas circulation capability of the gas between the first channel 92 and a first gap S is significantly improved, thereby improving a gas exchange rate between gas of the first space 70 and external gas of the electronic device 100.

Figure 14B:
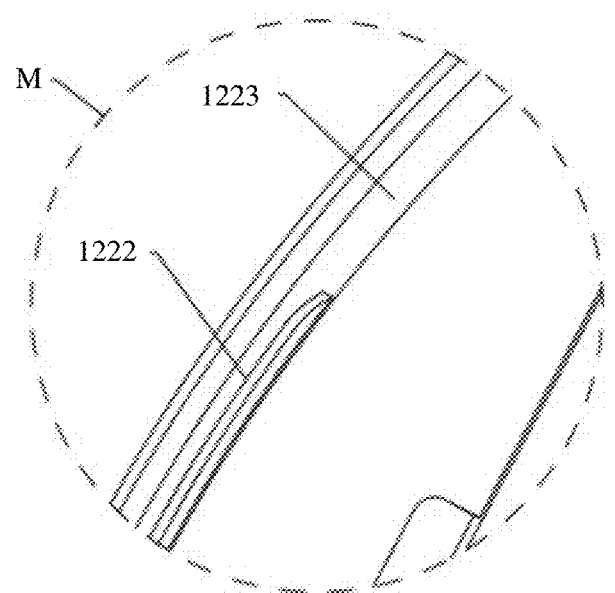
FIG. 14(b) is an enlarged schematic diagram of a position M in FIG. 14(a)

FIG. 14(b) is an enlarged schematic diagram of a position M in FIG. 14(a).

A second groove 1222 is disposed in a decorating ring 1212. An opening of the second groove 1222 is located on an inner side face 1217 of the decorating ring 1212, in other words, the second groove 1222 is recessed from the inside of the decorating ring 1212 to the outside of the decorating ring 1212. The second groove 1222 is annularly disposed along the inner side face 1217 of the decorating ring 1212. With reference to FIG. 11(a), the second groove 1222 is connected to the first gap S.

In this implementation, the second groove 1222 is disposed in the decorating ring 1212, and the second groove 1222 is connected to the first gap S, to significantly increase a volume of a connection position between the first channel 92 and the first gap S, thereby improving a gas circulation capability of gas between the first channel 92 and the first gap S, and then improving a gas exchange rate between gas of the first space 70 and external gas of the electronic device 100. In addition, because the second groove 1222 uses a space of the decorating ring 1212, when it is ensured that the first gap S has an enough circulation space, a first adhesive layer 122 may be disposed relatively close to the decorating ring 1212, so that the first adhesive layer 122 is relatively compactly assembled onto the decorating ring 1212, thereby reducing an overall volume.

In addition, when a cover 123 cannot be accurately assembled onto the decorating ring 1212, at least one position of a surface that is of the cover 123 and that faces the decorating ring 1212 is in contact with the inner side face 1217 of the decorating ring 1212. In this case, the contact position between the cover 123 and the decorating ring 1212 forms an unconnected region with a second channel 91. In this case, after gas in the first space 70 flows into the second channel 91 through a breathable space 1215, because the second groove 1222 is annularly disposed around the inner side face 1217 of the decorating ring 1212, the gas can bypass the unconnected region along the second groove 1222, and flow out of the electronic device 100 from a connected region between the second channel 91 and the first gap S, thereby quickly balancing air pressure of the first space 70 with external air pressure of the electronic device 100.

In this implementation, when the second groove 1222 is annularly disposed around the inner side face 1217 of the decorating ring 1212, the second groove 1222 can fit with the first channel 92, so that airflow blocking caused by blocking of a partial region of the first gap S can be better avoided, thereby ensuring that air pressure of the first space 70 can still be quickly balanced with external air pressure of the electronic device 100 when assembling accuracy of the cover 123 and the decorating ring 1212 is not enough.

Still refer to FIG. 14(a) and FIG. 14(b). In an implementation, a decorating part 121 further includes a reinforcing rib 1223. The reinforcing rib 1223 is disposed in the second groove 1222. In this case, the second groove 1222 is divided into a plurality of spaced-apart parts. It may be understood that the reinforcing rib 1223 can improve structural strength of the decorating ring 1212, and reduce a deformation risk of the decorating ring 1212. Therefore, when the decorating ring 1212 is squeezed or collided with by the outside, the decorating ring 1212 has enough strength to offset this part of pressure, to prevent the cover 123 from being crushed because the decorating ring 1212 is deformed, thereby effectively protecting the cover 123.

In an implementation, the reinforcing rib 1223 is formed integrally with the decorating ring 1212, to simplify a preparation step of the decorating part 121, thereby reducing costs of the decorating part 121.

In an implementation, an outer surface of the reinforcing rib 1223 is smoothly connected to the inner side face 1217 of the decorating ring 1212.

Figure 15A:
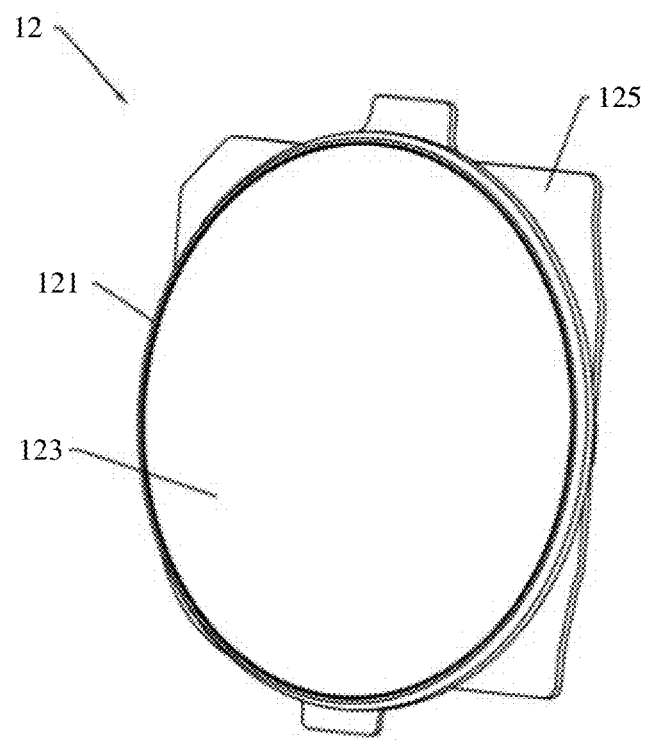
FIG. 15(a) is a schematic diagram of a structure of yet another implementation of a decorating assembly of the electronic device shown in FIG. 1.
Figure 15B:
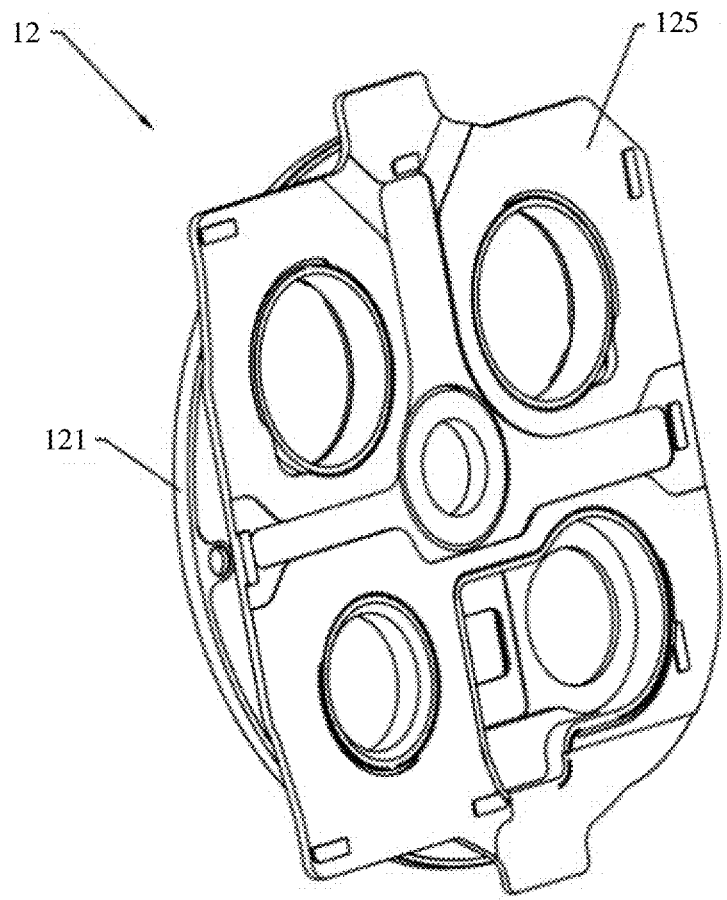
FIG. 15(b) is a schematic diagram of FIG. 15(a) at another angle.

FIG. 15(a) is a schematic diagram of a structure of yet another implementation of the decorating assembly of the electronic device shown in FIG. 1. FIG. 15(b) is a schematic diagram of FIG. 15(a) at another angle. This embodiment provides a decorating assembly 12 of a second structure. Most of same technical content of the decorating assembly 12 of the second structure as the decorating assembly 12 of the first structure is not described again.

Specifically, the decorating assembly 12 further includes a reinforcing bracket 125. A material of the reinforcing bracket 125 is the same as or may be different from a material of a decorating part 121. The reinforcing bracket 125 is configured to improve structural strength of the decorating assembly 12. The reinforcing bracket 125 is located on a side that is of the decorating part 121 and that faces away from a cover 123.

It may be understood that the reinforcing bracket 125 is connected to a positioning plate through fastening, to further improve structural strength of the decorating assembly 12. Specifically, when a user applies pressure to the decorating assembly 12, the reinforcing bracket 125 can assist the decorating assembly 12 in better supporting a pressing force of the user.

Figure 16:
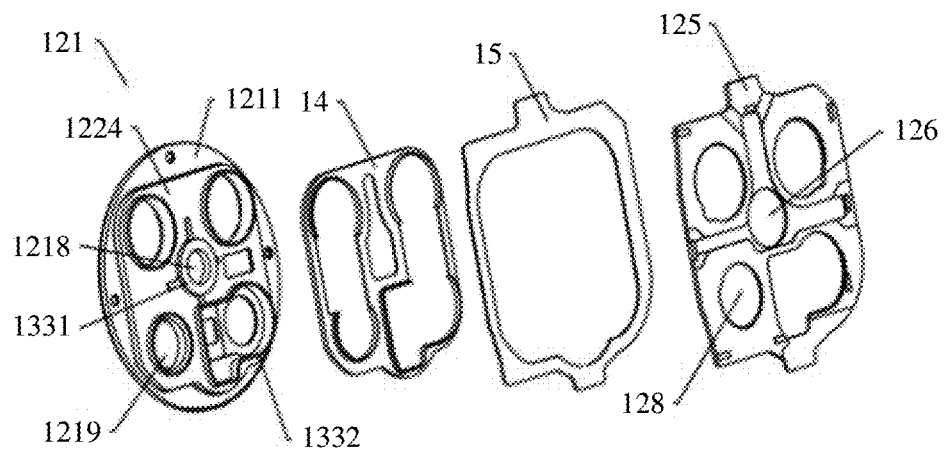
FIG. 16 is a schematic exploded diagram of a decorating assembly shown in FIG. 15(b)

FIG. 16 is a schematic exploded diagram of the decorating assembly 10 shown in FIG. 15(b).

The housing assembly 10 further includes a third adhesive layer 14. The third adhesive layer 14 is connected between the reinforcing bracket 125 and the positioning plate 1224 through fastening. It may be understood that the reinforcing bracket 125 is disposed on a side that is of the positioning plate 1224 and that is far away from the base 1211, to further improve structural strength of the decorating assembly 12. Specifically, when a user applies pressure to the housing 11, the decorating part 121 can assist the housing 11 in better supporting a pressing force of the user. In this case, the reinforcing bracket 125 is disposed on the side that is of the positioning plate 1224 and that is far away from the base 1211, so that the reinforcing bracket 125 can further improve structural strength of the decorating part 121. Therefore, when a user applies pressure to the housing 11, the reinforcing bracket 125 can further assist the housing 11 in better supporting a pressing force of the user.

In addition, a fifth through hole 126 is disposed in the reinforcing bracket 125. The fifth through hole 126 is connected to the first space 70.

In an implementation, a first protrusion 1331 protrudes from a surface that is of the positioning plate 1224 and that faces away from the base 1221. The first protrusion 1331 is disposed around a fourth through hole 1218. In this case, the first protrusion 1331 penetrates through the fifth through hole 126. It may be understood that the first protrusion 1331 may partially penetrate through the fifth through hole 126, or may completely penetrate through the fifth through hole 126.

In this implementation, the first protrusion 1331 protrudes from the surface that is of the positioning plate 1224 and that faces away from the base 1221, so that the first protrusion 1331 can further improve structural strength of the decorating part 121. Therefore, during a test, when pressure is applied to the housing 11, the first protrusion 1331 can further assist the housing 11 in better supporting an external pressing force.

In an implementation, a peripheral side face of the first protrusion 1331 is in contact with a wall of the fifth through hole 126. In this case, firmness of connection between the positioning plate 1224 and the reinforcing bracket 125 is better, and stability of the housing assembly 10 is better. In addition, gap fit or interference fit is implemented between the peripheral side face of the first protrusion 1331 and a wall face of the fifth through hole 126.

In an implementation, the first protrusion 1331 completely penetrates through the fifth through hole 126. In this case, the fourth through hole 1218 is directly connected to the first space 70. Therefore, a flowing path of external gas of the electronic device 100 is the same as a first path, in other words, does not change.

In addition, because external liquid of the electronic device 100 is blocked by a waterproof breathable film 124, a flowing path of an external water stain of the electronic device 100 does not change.

In an implementation, when the first protrusion 1331 partially extends into the fifth through hole 126, the decorating assembly 12 further includes a waterproof breathable film (not shown in the figure). A structure and a function of the waterproof breathable film are the same as those of the foregoing waterproof breathable film 124. The waterproof breathable film is connected to the reinforcing bracket 125 through fastening. The waterproof breathable film covers the fifth through hole 126. It may be understood that when the waterproof breathable film 124 disposed on a breathable space 1215 is damaged, liquid entering the breathable space 1215 flows into the fifth through hole 126 through the fourth through hole 1218. In this case, the waterproof breathable film can further prevent the inflow liquid from entering the first space 70, thereby further protecting components in the first space 70. In addition, when the waterproof breathable film is disposed on the reinforcing bracket 125, the foregoing waterproof breathable film may be alternatively omitted.

In an implementation, when the first protrusion 1331 completely penetrates through the fifth through hole 126, the fourth through hole 1218 is connected to the first space 70 through the fifth through hole 126. In this case, a flowing path of external gas of the electronic device 100 is a path obtained after the fifth through hole 126 is added between the fourth through hole 1218 and the first space 70 in the first path.

In addition, because external liquid of the electronic device 100 is blocked by the waterproof breathable film 124, a flowing path of the external liquid of the electronic device 100 does not change.

In addition, a third penetrating hole 128 is disposed in the reinforcing bracket 125. The third penetrating hole 128 is connected to the first space 70.

In an implementation, a second protrusion 1332 protrudes from the surface that is of the positioning plate 1224 and that faces away from the base 1221. The second protrusion 1332 is disposed around a second penetrating hole 1219. In this case, the second protrusion 1332 penetrates through the third penetrating hole 128. It may be understood that the second protrusion 1332 may partially penetrate through the third penetrating hole 128, or may completely penetrate through the third penetrating hole 128.

In this implementation, the second protrusion 1332 protrudes from the surface that is of the positioning plate 1224 and that faces away from the base 1221, so that the second protrusion 1332 can further improve structural strength of the decorating part 121. Therefore, when a user applies pressure to the housing 11, the second protrusion 1332 can further assist the housing 11 in better supporting a pressing force of the user.

In an implementation, a peripheral side face of the second protrusion 1332 is in contact with a wall of the third penetrating hole 128. In this case, firmness of connection between the positioning plate 1224 and the reinforcing bracket 125 is better, and stability of the housing assembly 10 is better. In addition, gap fit or interference fit is implemented between the peripheral side face of the second protrusion 1332 and a wall face of the fifth through hole 126.

In an implementation, the second protrusion 1332 completely extends into the third penetrating hole 128. In this case, the second penetrating hole 1219 is directly connected to the first space 70. Therefore, an ambient-light collection path of the photographing module 51 does not change.

In an implementation, when the second protrusion 1332 partially extends into the third penetrating hole 128, the second penetrating hole 1219 is connected to the first space 70 through the third penetrating hole 128. In this case, an ambient-light collection path of the photographing module 51 changes. A changed path is specifically "the outside of the electronic device 100—a first penetrating hole 1216—the second penetrating hole 1219—the third penetrating hole 128—the first space 70".

In an implementation, the decorating assembly 12 further includes a soft support part. There are a plurality of soft support parts. The plurality of soft support parts may be of a same shape, or may be of different shapes. In another implementation, there may be alternatively a single soft support part. The soft support part is disposed between the reinforcing bracket 125 and the positioning plate 1224. The soft support part can significantly improve overall support strength of the decorating assembly 12. When the housing 11 is stressed, the housing assembly 10 having the decorating assembly 12 can play a good buffer and support role.

In an implementation, a gap between the reinforcing bracket 125 and the positioning plate 1224 may also be used as a channel for connecting the fourth through hole 1218 to the first space 70, to ensure that gas in the first space 70 can be transmitted to the outside of the electronic device 100 or external gas of the electronic device 100 can quickly flow into the first space 70, thereby quickly balancing air pressure of the first space 70 with external air pressure of the electronic device 100.

Refer to FIG. 16 again. The housing assembly 10 further includes a fourth adhesive layer 15. A material of the fourth adhesive layer 15 is the same as a material of the third adhesive layer 14. An area of the fourth adhesive layer 15 is greater than an area of the third adhesive layer 14.

Figure 17:
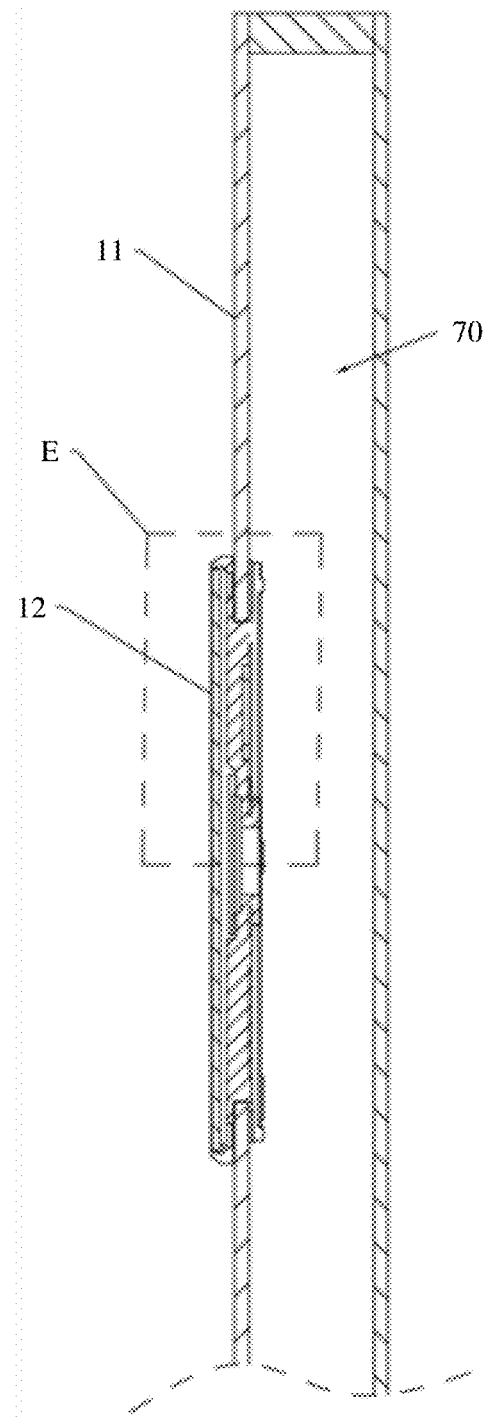
FIG. 17 is a partial schematic cross-sectional diagram of another implementation of the electronic device shown in FIG. 1 at a line A-A.
Figure 18:
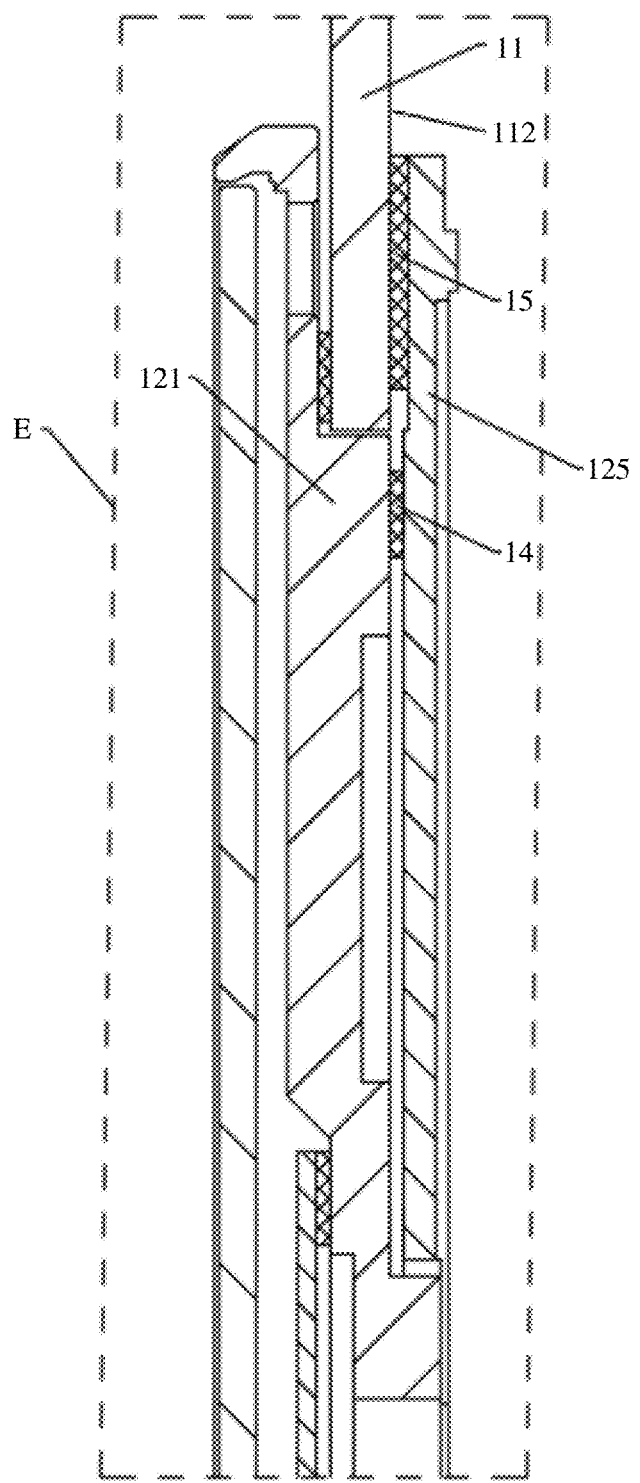
FIG. 18 is a schematic enlarged diagram of a position E of the electronic device shown in FIG. 17.

FIG. 17 is a partial schematic cross-sectional diagram of another implementation of the electronic device shown in FIG. 1 at a line A-A. FIG. 18 is a schematic enlarged diagram of a position E of the electronic device 100 shown in FIG. 17.

The reinforcing bracket 125 is located in the first space 70. The fourth adhesive layer 15 is disposed between the second face 112 and the reinforcing bracket 125. In this case, when the reinforcing bracket 125 is connected to the second face 112 of the housing 11 by using the fourth adhesive layer 15, the decorating part 121, the housing 11, and the reinforcing bracket 125 form a three-layer structure, in other words, the decorating part 121, the housing 11, and the reinforcing bracket 125 form a structure with better structural strength. In this case, overall stability and structural strength of the electronic device 100 are further improved. In addition, because the reinforcing bracket 125 is connected to the decorating part 121 by using the third adhesive layer 14, strength and stability of a structure formed by the decorating part 121, the housing 11, and the reinforcing bracket 125 are better.

Figure 19:
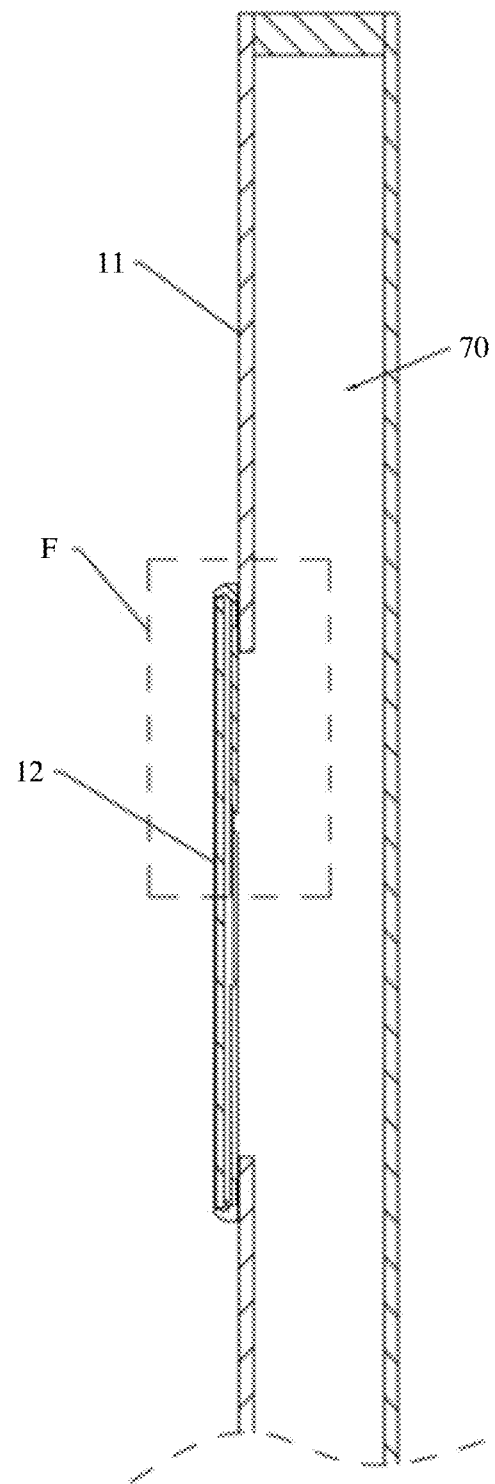
FIG. 19 is a partial schematic cross-sectional diagram of still another implementation of the electronic device shown in FIG. 1 at a line A-A.
Figure 20:
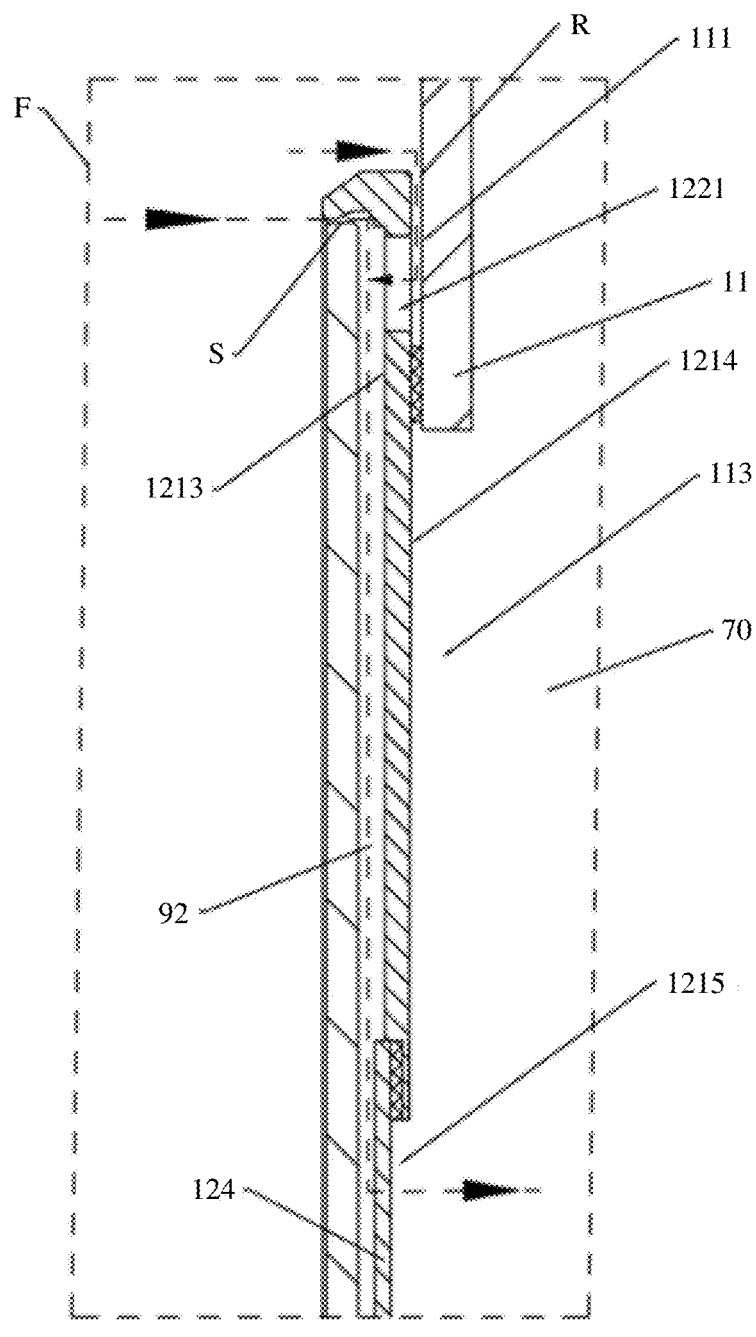
FIG. 20 is a schematic enlarged diagram of a position F of the electronic device shown in FIG. 19.

FIG. 19 is a partial schematic cross-sectional diagram of still another implementation of the electronic device 100 shown in FIG. 1 at a line A-A. FIG. 20 is a schematic enlarged diagram of a position F of the electronic device 100 shown in FIG. 19. This embodiment provides a decorating assembly 12 of a third structure. Most of same technical content as the decorating assembly 12 of the first structure and the decorating assembly 12 of the second structure is not described again. A difference is that a decorating part 121 includes neither a positioning plate 1224 nor a reinforcing bracket 125.

The decorating assembly 12 is located outside the housing 11. In addition, a second surface 1214 of a base 1211 is connected to a first face 111. A third through hole 113 is disposed in the housing 11. A breathable space 1215 is connected to the first space 70 through the third through hole 113. In this case, the third through hole 113 is used as a gas flowing channel and a light transmission channel.

Specifically, external gas of the electronic device 100 enters the first space 70 along the following third path. The third path is specifically "the outside of the electronic device 100—a first gap S—a first channel 92—the breathable space 1215—a waterproof breathable film 124—the third through hole 113—the first space 70".

In addition, the external gas of the electronic device 100 also enters the first space 70 along the following fourth path. The third path is specifically "the outside of the electronic device 100—a second gap R—a second through hole 1221—the first channel 92—the breathable space 1215—the waterproof breathable film 124—the third through hole 113—the first space 70".

In addition, because external liquid of the electronic device 100 is blocked by the waterproof breathable film 124, a flowing path of an external water stain of the electronic device 100 does not change.

In addition, an external-ambient-light collection path of the photographing module 51 is "the outside of the electronic device 100—a first penetrating hole 1216—the third through hole 113—the first space 70".

In this implementation, because no positioning plate 1224 is disposed on the decorating assembly 12, a structure of the decorating assembly 12 is relatively simple. In this case, when the housing assembly 10 having the decorating assembly 12 is applied to the electronic device 100, the electronic device 100 can implement lightweight disposition. In addition, because the structure of the decorating assembly 12 is relatively simple, the decorating assembly 12 is more easily assembled onto the housing 11, thereby significantly reducing assembling difficulty of the housing assembly 10.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A decorating assembly, comprising:
    a decorating part, comprising a base and a decorating ring, wherein a first surface of the base is opposite to a second surface of the base, the base defines a breathable space that extends within a perimeter of the decorating ring from the first surface to the second surface, and the decorating ring protrudes from a peripheral edge of the first surface;
    a first adhesive layer disposed within the perimeter of the decorating ring and connected to the first surface through fastening, wherein the first adhesive layer defines a first channel connected to the breathable space;
    a cover connected, through fastening, to a surface of the first adhesive layer that faces away from the base, wherein a first gap is between a peripheral side face of the cover and an inner side face of the decorating ring, and the first gap is connected to the breathable space through the first channel; and
    a waterproof breathable film fastened onto the base and covering the breathable space.

2. The decorating assembly according to claim 1, wherein the first adhesive layer defines a plurality of first channels, and the plurality of first channels extend from the breathable space in different directions.

3. The decorating assembly according to claim 1, wherein a second channel is defined by the first adhesive layer and the inner side face of the decorating ring, and the second channel is connected to the first gap and the first channel.

4. The decorating assembly according to claim 3, wherein a first groove extends in the first surface of the base, and the first groove faces and is connected to the first channel.

5. The decorating assembly according to claim 1, wherein a second groove extends in the inner side face of the decorating ring, the second groove is annularly disposed along the inner side face of the decorating ring, and the second groove is connected to the first gap.

6. The decorating assembly according to claim 5, wherein the decorating part further comprises a reinforcing rib, and the reinforcing rib is disposed in the second groove.

7. The decorating assembly according to claim 1, wherein the decorating part further comprises a positioning plate, and the positioning plate protrudes from the second surface.

8. A housing assembly, comprising:
    a housing, comprising a first face and a second face that is opposite to the first face, wherein a first space is defined at least in part by a side of the second face that faces away from the first face; and
    a decorating assembly, comprising:
        a decorating part, comprising a base and a decorating ring, wherein a first surface of the base is opposite to a second surface of the base, the base defines a breathable space that extends within a perimeter of the decorating ring from the first surface to the second surface, and the decorating ring protrudes from a peripheral edge of the first surface;
        a first adhesive layer disposed within the perimeter of the decorating ring and connected to the first surface through fastening, wherein the first adhesive layer defines a first channel connected to the breathable space;
        a cover connected, through fastening, to a surface of the first adhesive layer that faces away from the base, wherein a first gap is between a peripheral side face of the cover and an inner side face of the decorating ring, and the first gap is connected to the breathable space through the first channel; and
        a waterproof breathable film fastened onto the base and covering the breathable space; and
    wherein the base of the decorating assembly is located on a side of the first face that faces away from the second face, the second surface of the base faces the first face, and the breathable space of the base is connected to the first space.

9. The housing assembly according to claim 8, wherein a second gap is between the second surface and the first face, a second through hole extends in the base, the second through hole is disposed inside the decorating ring, the second through hole extends from the first surface to the second surface, and the second through hole is connected to the first channel and the second gap.

10. The housing assembly according to claim 9, wherein a third through hole extends in the housing, the third through hole extends from the first face to the second face, and the third through hole is connected to the breathable space and the first space.

11. The housing assembly according to claim 10, further comprising:
a second adhesive layer disposed on a side of the second through hole that is closest to the third through hole and is disposed around the second through hole, wherein the second adhesive layer is connected between the second surface and the first face through fastening.

12. The housing assembly according to claim 9, wherein a third through hole extends in the housing, the third through hole extends from the first face to the second face, and a part of the decorating assembly extends into the first space through the third through hole.

13. The housing assembly according to claim 8, wherein the decorating assembly further comprises a reinforcing bracket, and the reinforcing bracket is connected to the decorating part of the decorating assembly through fastening.

14. The housing assembly according to claim 13, wherein the decorating assembly further comprises a fourth adhesive layer, and the fourth adhesive layer is connected between the reinforcing bracket and the second face through fastening.

15. An electronic device, comprising:
an audio component; and
a housing assembly, comprising:
  a housing, comprising a first face and a second face that is opposite to the first face, wherein a first space is defined at least in part by a side of the second face that faces away from the first face; and
  a decorating assembly, comprising:
    a decorating part, comprising a base and a decorating ring, wherein a first surface of the base is opposite to a second surface of the base, the base defines a breathable space that extends within a perimeter of the decorating ring from the first surface to the second surface, and the decorating ring protrudes from a peripheral edge of the first surface;
    a first adhesive layer disposed within a perimeter of the decorating ring and connected to the first surface through fastening, wherein the first adhesive layer defines a first channel connected to the breathable space;
    a cover connected, through fastening, to a surface of the first adhesive layer that faces away from the base, wherein a first gap is between a peripheral side face of the cover and an inner side face of the decorating ring, and the first gap is connected to the breathable space through the first channel; and
    a waterproof breathable film fastened onto the base and covering the breathable space, wherein the base of the decorating assembly is located on a side of the first face that faces away from the second face, the second surface of the base faces the first face, and the breathable space of the base is connected to the first space; and
wherein the audio component is located in the first space, and a rear box of the audio component is connected to the first space.

16. The electronic device according to claim 15, further comprising:
a photographing component installed in the first space through fastening; and
wherein a first penetrating hole extends in the base, the first penetrating hole extends from the first surface to the second surface, the first penetrating hole is in an enclosed region of the first adhesive layer, the first penetrating hole is connected to the first space, and the photographing component is configured to collect ambient light emitted through the cover and the first penetrating hole.

17. The electronic device according to claim 15, wherein a second gap is between the second surface and the first face, a second through hole extends in the base, the second through hole is disposed inside the decorating ring, the second through hole extends from the first surface to the second surface, and the second through hole is connected to the first channel and the second gap.

18. The electronic device according to claim 17, wherein a third through hole extends in the housing, the third through hole extends from the first face to the second face, and the third through hole is connected to the breathable space and the first space.

19. The electronic device according to claim 18, further comprising:
a second adhesive layer disposed on a side of the second through hole that is closest to the third through hole and is disposed around the second through hole, wherein the second adhesive layer is connected between the second surface and the first face through fastening.

20. The electronic device according to claim 17, wherein a third through hole extends in the housing, the third through hole extends from the first face to the second face, and a part of the decorating assembly extends into the first space through the third through hole.

* * * * *